(12) United States Patent
Kim et al.

(10) Patent No.: US 11,978,841 B2
(45) Date of Patent: May 7, 2024

(54) DISPLAY APPARATUS

(71) Applicant: Samsung Display Co., Ltd., Yongin-si (KR)

(72) Inventors: Jeehoon Kim, Yongin-si (KR); Shinhyuk Yang, Yongin-si (KR); Huiwon Yang, Yongin-si (KR); Jongmoo Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 406 days.

(21) Appl. No.: 17/449,414

(22) Filed: Sep. 29, 2021

(65) Prior Publication Data
US 2022/0285595 A1  Sep. 8, 2022

(30) Foreign Application Priority Data

Mar. 4, 2021 (KR) .................... 10-2021-0029085

(51) Int. Cl.
| | |
|---|---|
| *H01L 33/62* | (2010.01) |
| *H01L 23/525* | (2006.01) |
| *H01L 25/16* | (2023.01) |
| *H01L 27/15* | (2006.01) |
| *H01L 33/38* | (2010.01) |
| *H10K 59/131* | (2023.01) |
| *H10K 59/88* | (2023.01) |
| *H10K 71/00* | (2023.01) |

(52) U.S. Cl.
CPC ............ *H01L 33/62* (2013.01); *H01L 27/156* (2013.01); *H01L 33/38* (2013.01)

(58) Field of Classification Search
CPC ....... H01L 33/62; H01L 27/156; H01L 33/38; H01L 25/167; H01L 23/5252; H10K 59/131; H10K 59/88; H10K 71/861
See application file for complete search history.

(56) References Cited

U.S. PATENT DOCUMENTS

| | | | |
|---|---|---|---|
| 6,380,992 B1 | 4/2002 | Lee | |
| 6,922,226 B2 | 7/2005 | Park et al. | |
| 2015/0379908 A1* | 12/2015 | Kim ................... | G09G 3/006 |
| | | | 345/84 |
| 2020/0212054 A1 | 7/2020 | Lee | |

FOREIGN PATENT DOCUMENTS

| | | |
|---|---|---|
| KR | 10-0474002 B1 | 7/2005 |
| KR | 10-0704783 B1 | 4/2007 |
| KR | 10-0734232 B1 | 7/2007 |
| KR | 10-2020-0081825 A | 7/2020 |

* cited by examiner

*Primary Examiner* — Herve-Louis Y Assouman
(74) *Attorney, Agent, or Firm* — Lewis Roca Rothgerber Christie LLP

(57) ABSTRACT

A display apparatus includes a display area including pixels on a substrate, a pad portion on the substrate in a non-display area outside the display area, and including a conductive line, a first dummy line around the conductive line, and a first anti-fuse and a second anti-fuse adjacent to the conductive line and spaced apart from each other in a lengthwise direction of the conductive line, the first anti-fuse and the second anti-fuse each including a first electrode electrically connected to a portion of the conductive line, and a second electrode over the first electrode with a first insulating layer therebetween, and electrically connected to a portion of the first dummy line, and a circuit portion overlapping, and electrically connected to, the pad portion.

20 Claims, 25 Drawing Sheets

DISPLAY APPARATUS

CROSS-REFERENCE TO RELATED APPLICATION

This application claims priority to, and the benefit of, Korean Patent Application No. 10-2021-0029085, filed on Mar. 4, 2021, in the Korean Intellectual Property Office, the disclosure of which is incorporated by reference herein in its entirety.

BACKGROUND

1. Field

One or more embodiments relate to a display apparatus including a pad portion in which damage is repairable.

2. Description of the Related Art

A display apparatus visually displays data. Display apparatuses are used as displays for small products, such as mobile phones, and are also used as displays for large-scale products, such as televisions.

The display apparatus may include wirings configured to provide a signal or a voltage to pixels arranged in a display area. The display apparatus may include wirings and a pad, the wirings being configured to transfer an electric signal or a voltage to pixels, and the pad connecting a driver to a controller.

SUMMARY

One or more embodiments include a display apparatus including a structure configured to repair damage to a pad portion. However, such a technical problem is an example, and the disclosure is not limited thereto.

Additional aspects will be set forth in part in the description that follows and, in part, will be apparent from the description, or may be learned by practice of the presented embodiments of the disclosure.

According to one or more embodiments, a display apparatus includes a display area including pixels on a substrate, a pad portion on the substrate in a non-display area outside the display area, and including a conductive line, a first dummy line around the conductive line, and a first anti-fuse and a second anti-fuse adjacent to the conductive line and spaced apart from each other in a lengthwise direction of the conductive line, the first anti-fuse and the second anti-fuse each including a first electrode electrically connected to a portion of the conductive line, and a second electrode over the first electrode with a first insulating layer therebetween, and electrically connected to a portion of the first dummy line, and a circuit portion overlapping, and electrically connected to, the pad portion.

The first electrode of the first anti-fuse and the first electrode of the second anti-fuse may be integral with a portion of the conductive line.

The conductive line may include a body portion overlapping the circuit portion, and a pair of connectors respectively on opposite sides of the body portion, and connected to the body portion through an insulating layer between the body portion and the pair of connectors.

The first anti-fuse and the second anti-fuse may each further include a third electrode spaced apart from the first electrode with the first insulating layer therebetween.

The pad portion may further include a second dummy line electrically connected to the third electrode of the first anti-fuse and to the third electrode of the second anti-fuse.

The second dummy line may be integral with the third electrode of the first anti-fuse and with the third electrode of the second anti-fuse.

The first insulating layer may include a first portion on the substrate, a second portion between the first electrode and the second electrode, and having a thickness that is less than a thickness of the first portion, and a third portion between the first electrode and the third electrode, and having a thickness that is less than the thickness of the first portion.

At least one of the first anti-fuse and the second anti-fuse may further include a metal oxide layer on the first electrode thereof.

At least one of the first anti-fuse and the second anti-fuse may further include a semiconductor layer connected to the second electrode thereof, and located between the first electrode and the second electrode thereof.

At least one of the first anti-fuse and the second anti-fuse may further include an upper electrode on the semiconductor layer.

An area of the upper electrode may be greater than an area of the first electrode.

The pad portion may further include a third dummy line electrically connected to the third electrode of the first anti-fuse, and a fourth dummy line spaced apart from the third dummy line, and electrically connected to the third electrode of the second anti-fuse.

The third dummy line may be integral with the third electrode of the first anti-fuse, wherein the fourth dummy line is integral with the third electrode of the second anti-fuse.

According to one or more embodiments, a display apparatus includes a display area including pixels on a substrate, a pad portion on the substrate in a non-display area outside the display area, and including a conductive line, a first dummy line, and a first anti-fuse electrically connected to the conductive line and to the first dummy line, and including a first electrode, and a second electrode spaced apart from the first electrode with a first insulating layer therebetween, and a circuit portion overlapping the pad portion and electrically connected to the pad portion, and including a counter conductive line overlapping the conductive line, and a first counter conductive line overlapping the first dummy line.

The display apparatus may further include an upper insulating layer covering an edge of the first dummy line, and defining an opening overlapping the first dummy line.

The first anti-fuse may further include a third electrode spaced apart from the first electrode with the first insulating layer therebetween.

The pad portion may further include a second dummy line electrically connected to the third electrode of the first anti-fuse.

The circuit portion may further include a second counter conductive line overlapping the second dummy line.

The first insulating layer may include a first portion on the substrate, a second portion between the first electrode and the second electrode, and having a thickness that is less than a thickness of the first portion, and a third portion between the first electrode and the third electrode, and having a thickness that is less than the thickness of the first portion.

The conductive line may include a body portion overlapping the circuit portion, and a pair of connectors respectively on opposite sides of the body portion, and connected to the body portion through an insulating layer between the body portion and the pair of connectors.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
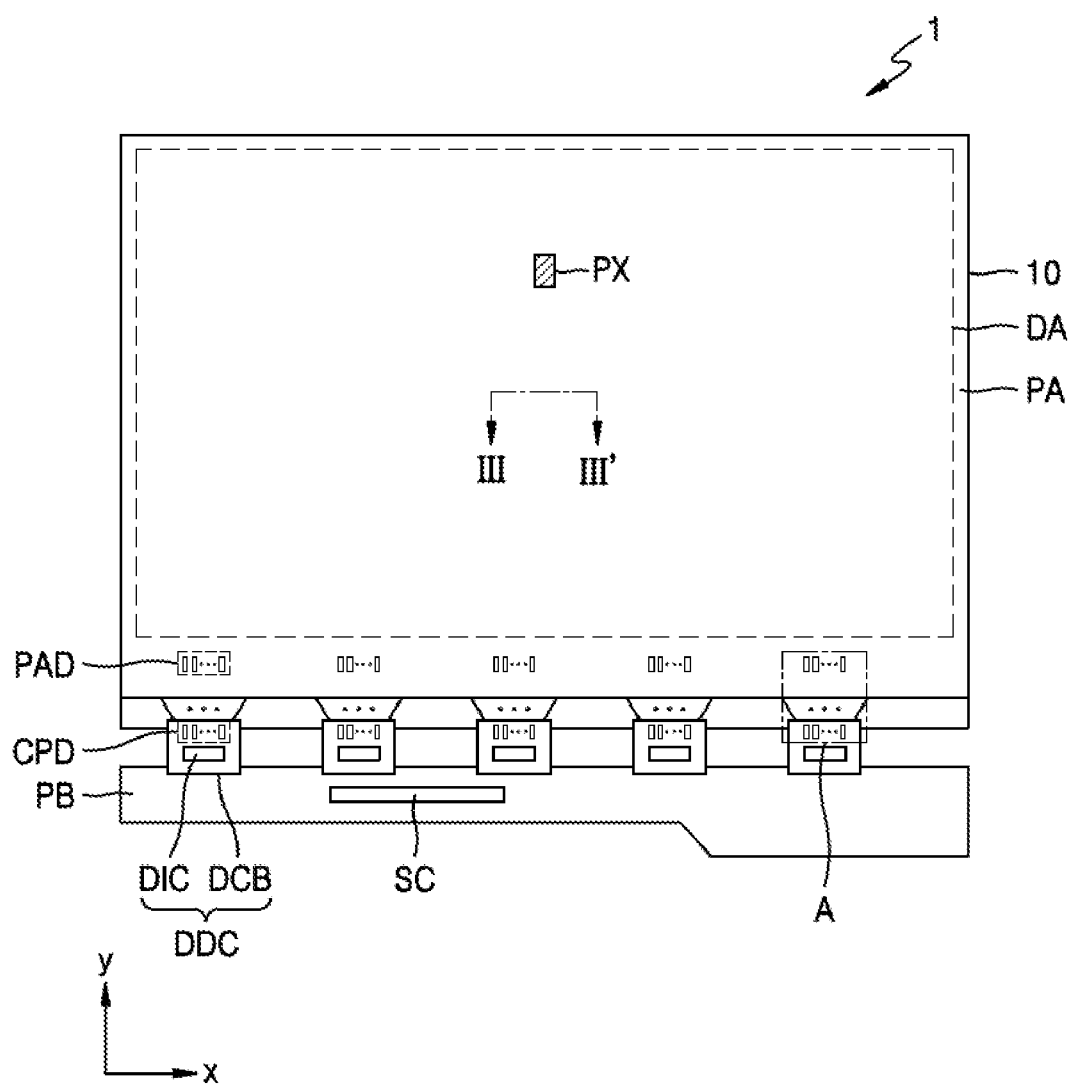
FIG. 1 is a plan view of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display apparatus 1 according to some embodiments.

Referring to FIG. 1, the display apparatus 1 includes a display area DA and a peripheral area PA outside the display area DA. The peripheral area PA may be a kind of non-display area in which display elements are not arranged. The peripheral area PA may entirely surround the display area DA.

In a plan view, the display area DA may be provided in a rectangular shape as shown in FIG. 1. In other embodiments, the display area DA may have a polygonal shape such as a triangle, a pentagon, and a hexagon, a circular shape, an elliptical shape, or an irregular shape.

The display area DA of a display panel 10 may include a plurality of pixels PX. The pixels PX may be arranged in various configurations, such as a stripe configuration and a PENTILE® configuration to display an image (e.g., a PENTILE® matrix structure, an RGBG structure, or a PENTILE® structure). PENTILE® is a registered trademark of Samsung Display Co., Ltd., Republic of Korea. The plurality of pixels PX may be divided into a plurality of groups depending on a displayed color. The plurality of pixels PX may each display an image by using light emitted from a display element such as a light-emitting diode.

Various wirings and pad portions PAD may be arranged in the peripheral area PA of the display panel 10, the various wirings being configured to transfer an electric signal to be applied to the display area DA, and a printed circuit board or a driver integrated circuit (IC) chip being attached to the pad portions PAD.

The pad portion PAD is electrically connected to a circuit portion DDC. One side of the circuit portion DDC may be electrically connected to the pad portion PAD, and another side of the circuit portion DDC may be electrically connected to a printed circuit board PB on which a controller SC is arranged. The circuit portion DDC may include a flexible circuit board DCB including a counter pad CPD connected to the pad portion PAD of the display panel 10. A driver DIC may be arranged in the form of an IC chip on the flexible circuit board DCB, the driver DIC being configured to provide an electric signal such as a data signal to the pixel PX.

Figure 2:
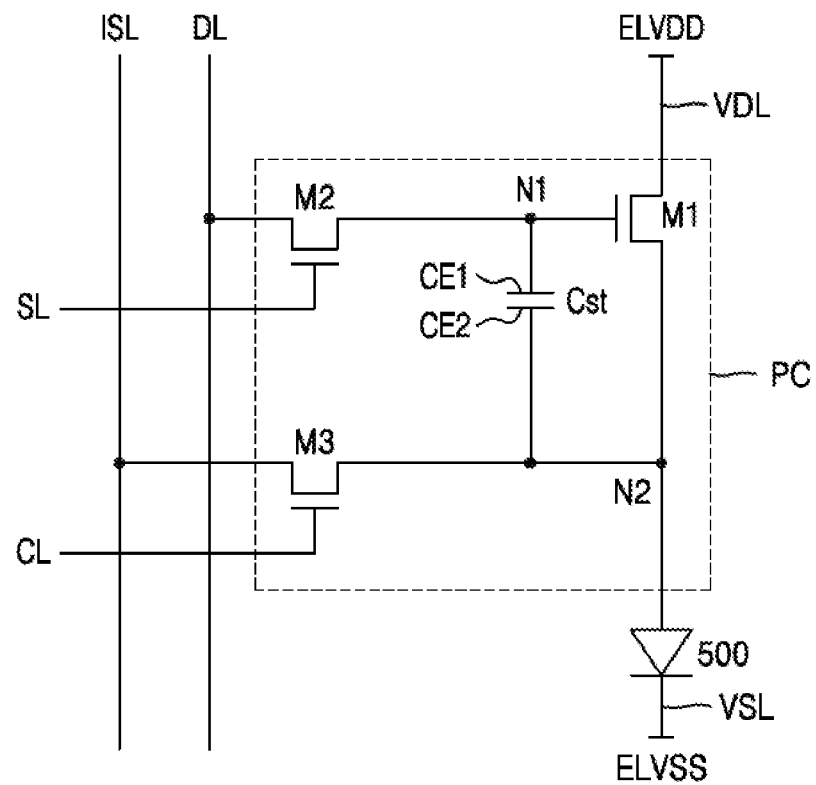
FIG. 2 is an equivalent circuit diagram of a light-emitting diode included in a display panel of a display apparatus according some embodiments and a pixel circuit electrically connected to the light-emitting diode.

FIG. 2 is an equivalent circuit diagram of a light-emitting diode included in the display panel 10 of a display apparatus according some embodiments and a pixel circuit electrically connected to the light-emitting diode.

Referring to FIG. 2, an anode electrode of a light-emitting diode 500 may be connected to a pixel circuit PC, and a cathode electrode may be electrically connected to a common voltage line VSL configured to provide a common power voltage ELVSS. The light-emitting diode 500 may emit light at a brightness corresponding to the amount of current supplied from the pixel circuit PC.

The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor TFT including a semiconductor layer including an oxide semiconductor, or a silicon semiconductor thin-film transistor TFT including a semiconductor layer including polycrystalline silicon.

The first transistor M1 may be a driving transistor. A source electrode of the first transistor M1 may be connected to a driving voltage line VDL, and a drain electrode may be connected to the light-emitting diode 500. A gate electrode of the first transistor M1 may be connected to a first node N1.

The second transistor M2 may be a switching transistor. A source electrode of the second transistor M2 may be connected to a data line DL, and a drain electrode may be connected to the first node N1. A gate electrode of the second transistor M2 may be connected to a scan line SL. The second transistor M2 may be turned on when a scan signal is supplied to the scan line SL to electrically connect the data line DL to the first node N1.

The third transistor M3 may be an initialization transistor and/or a sensing transistor. A source electrode of the third transistor M3 may be connected to a second node N2, and a drain electrode may be connected to an initialization-sensing line ISL. A gate electrode of the third transistor M3 may be connected to a control line CL. The third transistor M3 may be turned on when a control signal is supplied to the control line CL to electrically connect the initialization-sensing line ISL to the second node N2. In some embodiments, the third transistor M3 may be turned on according to a signal transferred through the control line CL to initialize the anode electrode of the light-emitting diode 500. In other embodiments, the third transistor M3 may be turned on when a control signal is supplied to the control line CL to sense characteristic information of the light-emitting diode 500. The third transistor M3 may have both a function of the initialization transistor and a function of the sensing transistor, or may have one of the two functions. In the case where the third transistor M3 has a function of the initialization transistor, the initialization-sensing line ISL may be named as an initialization voltage line. In the case where the third transistor M3 has a function of the sensing transistor, the initialization-sensing line ISL may be named as a sensing line. An initialization operation and a sensing operation of the third transistor M3 may be performed individually/independently or concurrently/substantially simultaneously.

The storage capacitor Cst may be connected between the first node N1 and the second node N2. As an example, a first capacitor electrode CE1 of the storage capacitor Cst may be connected to the gate electrode of the first transistor M1, and a second capacitor electrode CE2 of the storage capacitor Cst may be connected to the anode electrode of the light-emitting diode 500.

Though FIG. 2 shows the first transistor M1, the second transistor M2, and the third transistor M3 as n-channel metal oxide semiconductor (NMOS) transistors, the present disclosure is not limited thereto. As an example, at least one of the first transistor M1, the second transistor M2, and the third transistor M3 may be provided as p-channel MOS transistors.

Though FIG. 2 shows three transistors, the present disclosure is not limited thereto. The pixel circuit PC may include four or more transistors.

Figure 3:
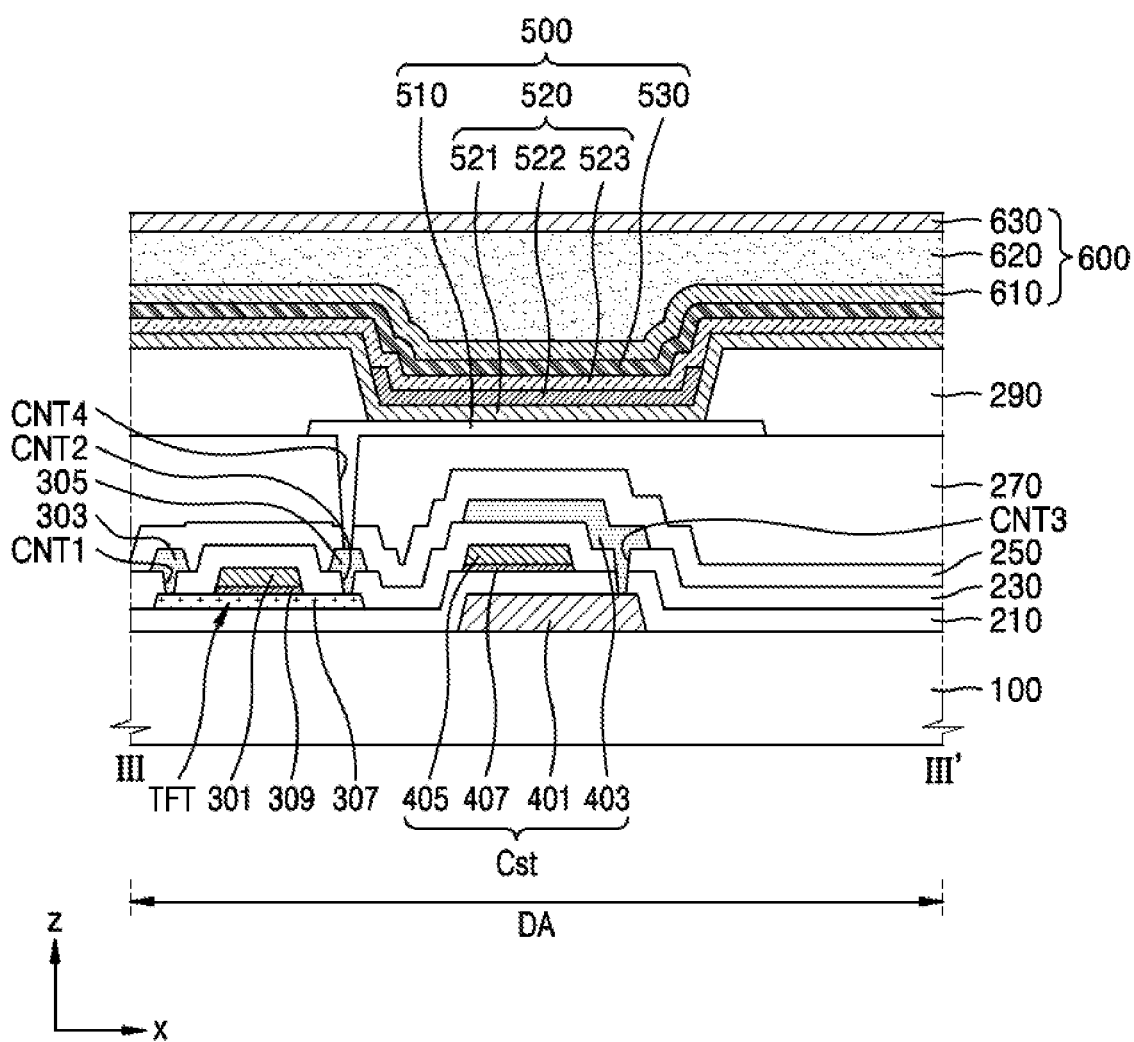
FIG. 3 is a cross-sectional view of a portion of the display apparatus of FIG. 1, taken along the line III-III'.

FIG. 3 is a cross-sectional view of a portion of the display apparatus of FIG. 1, taken along the line III-III'.

Referring to FIG. 3, the display apparatus according to some embodiments may include a substrate 100 and a thin-film transistor TFT arranged in the display area DA.

The substrate 100 may include glass, metal, or a polymer resin. In the case where the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. However, this is an example and the present disclosure is not limited thereto.

The substrate 100 may have a single-layered structure or a multi-layered structure including the above materials. In the case where the substrate 100 has a multi-layered structure, an inorganic insulating layer may be further provided. In some embodiments, the substrate 100 may have a structure of an organic insulating material/an inorganic insulating material/an organic insulating material/an inorganic insulating material such as a polymer resin.

A thin-film transistor TFT may be arranged over the substrate 100 in the display area DA. The light-emitting diode 500 may be arranged on the thin-film transistor TFT, the light-emitting diode 500 being electrically connected to the thin-film transistor TFT. In detail, the thin-film transistor TFT may be electrically connected to an anode electrode 510 of the light-emitting diode 500.

The thin-film transistor TFT may include a semiconductor layer 307, a gate electrode 301, a source electrode 303, and a drain electrode 305, the gate electrode 301 overlapping a channel region of the semiconductor layer 307, and the source electrode 303 and the drain electrode 305 being respectively connected to a source region and a drain region of the semiconductor layer 307. In addition, the storage capacitor Cst may include a first capacitor electrode 405, a second capacitor electrode 401, and a third capacitor electrode 403.

The semiconductor layer 307 of the thin-film transistor TFT may include an oxide semiconductor material. The oxide semiconductor may include indium gallium zinc oxide (IGZO), zinc tin oxide (ZTO), and zinc indium oxide (ZI0). The semiconductor layer 307 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al) cesium (Cs), cerium (Ce), and zinc (Zn). As an example, the semiconductor layer 307 may be a semiconductor layer including one of InSnZnO (ITZO), InGaZnO (IGZO), and InSnGaO (ITGO). However, this is only an example, and the present disclosure is not limited thereto. In other embodiments, the semiconductor layer 307 may include polycrystalline silicon, amorphous silicon, or an organic semiconductor.

The gate electrode 301 of the thin-film transistor TFT may overlap the channel region of the semiconductor layer 307 with a gate insulating layer 309 therebetween. The gate insulating layer 309 may be formed during the same mask process as a mask process of forming the gate electrode 301. The gate electrode 301 may include a conductive material including molybdenum (Mo), aluminum (Al), copper (Cu), and/or titanium (Ti), and may include a multi-layer or a single layer including one or more of the above materials. In some embodiments, the gate electrode 301 may have a multi-layered structure including a metal layer including the above metal elements, and a transparent conductive oxide layer including ITO on the metal layer. In addition, the gate insulating layer 309 may include an inorganic material such as silicon oxide, silicon nitride, and/or silicon oxynitride.

The source electrode 303 of the thin-film transistor TFT may be electrically connected to the semiconductor layer 307 through a first contact hole CNT1. The drain electrode 305 may be electrically connected to the semiconductor layer 307 through a second contact hole CNT2.

The storage capacitor Cst may include at least two electrodes. In some embodiments, it is shown in FIG. 3 that the storage capacitor Cst includes the first capacitor electrode 405, the second capacitor electrode 401, and the third capacitor electrode 403. The second capacitor electrode 401 may be apart from the first capacitor electrode 405 with an insulating layer therebetween. The third capacitor electrode 403 may be apart from the first capacitor electrode 405 with an insulating layer therebetween. The second capacitor electrode 401 may be electrically connected to the third capacitor electrode 403 through a third contact hole CNT3. The first capacitor electrode 405, the second capacitor electrode 401, and the third capacitor electrode 403 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), and/or copper (Cu). In some embodiments, the first capacitor electrode 405, the second capacitor electrode 401, and the third capacitor electrode 403 may have a multi-layered structure including a metal layer and/or a transparent conductive oxide layer, the metal layer including one or more of the above metal elements, and the transparent conductive oxide layer including ITO on the metal layer.

The first capacitor electrode 405 of the storage capacitor Cst may be formed during the same process as a process of forming the gate electrode 301, and may include the same material as that of the gate electrode 301. An insulating layer 407 may be arranged under the first capacitor electrode 405, the insulating layer 407 including the same material as that of the gate insulating layer 309. The insulating layer 407 under the first capacitor electrode 405 may be formed concurrently/substantially simultaneously during the same mask process as a mask process of forming the first capacitor electrode 405. In other embodiments, the gate insulating layer 309 and the insulating layer 407 may be formed as one body. In this case, a process of forming the gate electrode 301 and the first capacitor electrode 405, and a process of forming the gate insulating layer 309 and the insulating layer 407, may be performed separately.

A first insulating layer 210 may be arranged between the thin-film transistor TFT and the substrate 100. A second insulating layer 230 may be arranged on the first insulating layer 210. A third insulating layer 250 may be arranged on the second insulating layer 230. A fourth insulating layer 270 may be arranged on the third insulating layer 250.

The first insulating layer 210 may be a buffer layer configured to reduce or block the penetration of foreign substance, moisture, or external air from below the substrate 100, and may provide a flat surface on the substrate 100. The first insulating layer 210 may include an inorganic material, such as an oxide or a nitride, an organic material, or an organic/inorganic composite material, and may include a single-layered structure or a multi-layered structure including an inorganic material and an organic material.

The second insulating layer 230 may cover the upper surface of each of the gate electrode 301 and the first capacitor electrode 405, and may be arranged under the source electrode 303, the drain electrode 305, and the third capacitor electrode 403. The second insulating layer 230 may be an inorganic insulating layer including an inorganic material. For the inorganic material, polysiloxane, silicon nitride, silicon oxide, and/or silicon oxynitride may be used. In addition, the second insulating layer 230 may include a single layer or a multi-layer including an inorganic material such as silicon nitride and/or silicon oxide. The second insulating layer 230 may be introduced to cover and to protect some wirings arranged on the first insulating layer 210.

The third insulating layer 250 may cover at least a portion of an upper surface of each of the source electrode 303, the drain electrode 305, and the third capacitor electrode 403. The third insulating layer 250 may include an inorganic material such as silicon oxide, silicon nitride, and/or silicon oxynitride. The third insulating layer 250 may be a passivation layer configured to protect the source electrode 303 and/or the drain electrode 305.

The fourth insulating layer 270 may be arranged on the third insulating layer 250. The fourth insulating layer 270 may be a planarization insulating layer. The fourth insulating layer 270 may include an organic insulating material. The organic insulating material may include, for example, a general-purpose polymer, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. These are mere examples and the present disclosure is not limited thereto.

The thin-film transistor TFT may be electrically connected to the anode electrode 510 arranged on the fourth insulating layer 270. In some embodiments, the anode electrode 510 may be electrically connected to the source electrode 303 or electrically connected to the drain electrode 305 of the thin-film transistor TFT through a contact hole CNT4 defined in the fourth insulating layer 270.

The anode electrode 510 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In other embodiments, the anode electrode 510 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof.

A bank layer 290 may be arranged on the fourth insulating layer 270. The bank layer 290 may include a pixel opening corresponding to each pixel. The pixel opening of the bank layer 290 is an opening that exposes the central portion of the anode electrode 510. The bank layer 290 may define a pixel through the pixel opening. The bank layer 290 may include an organic material such as polyimide or hexamethyldisiloxane.

An intermediate layer 520 is arranged inside the opening defined by the bank layer 290 and includes an emission layer 522 overlapping the anode electrode 510. The intermediate layer 520 may include a first functional layer 521 and/or a second functional layer 523, the first functional layer 521 being under the emission layer 522, and the second functional layer 523 being on the emission layer 522.

The first functional layer 521 may include a single layer or a multi-layer. The first functional layer 521 may include a hole injection layer (HIL) and/or a hole transport layer (HTL).

Figure 5:
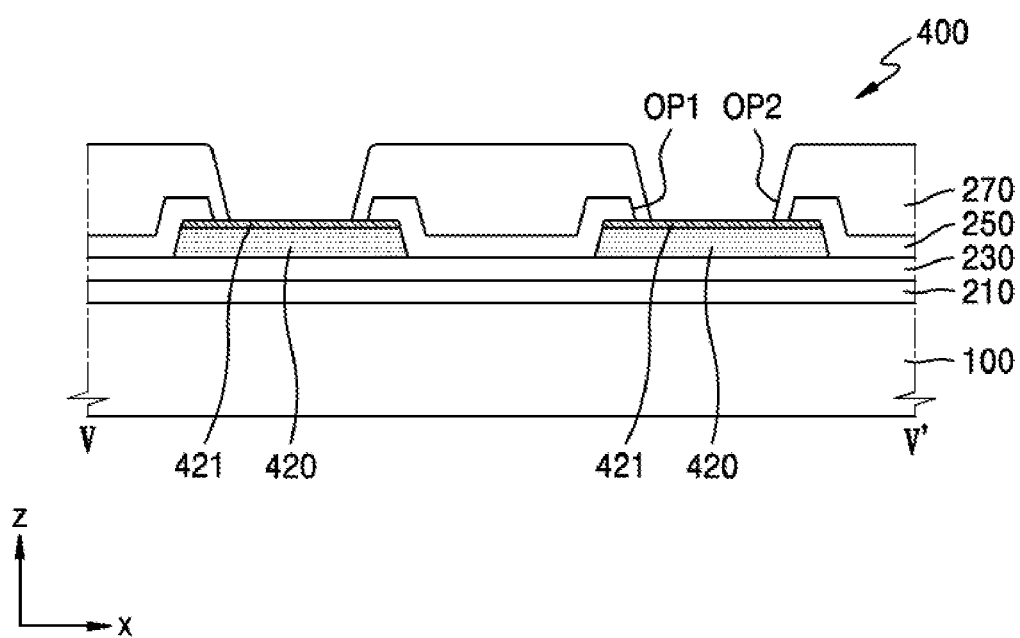
FIG. 5 is a cross-sectional view of a pad portion of FIG. 4, taken along the line V-V'.

The emission layer 522 may include a polymer organic material or a low-molecular weight organic material that emits light having a preset color. The second functional layer 523 may include an electron transport layer (ETL) and/or an electron injection layer (EIL). As shown in FIG. 5, the emission layer 522 may be patterned to correspond to each of the anode electrodes 510 or may include a layer, which is one body, covering a plurality of anode electrodes 510 according to other embodiments.

The cathode electrode 530 may be a transparent electrode or a reflective electrode. In some embodiments, the cathode electrode 530 may be a transparent or semi-transparent electrode and may include a conductive material having a small work function and including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In addition, the cathode electrode 530 may further include a transparent conductive oxide (TCO) layer including ITO, IZO, ZnO, or $In_2O_3$. The cathode electrode 530 may be arranged over the display area DA and may be arranged on the intermediate layer 520. The cathode electrode 530 may be formed as one body over the plurality of light-emitting diodes 500 to correspond to the plurality of anode electrodes 510.

Because the light-emitting diode 500 including a multi-layered structure of the anode electrode 510, the intermediate layer 520, and the cathode electrode 530 may be easily damaged by moisture or oxygen, etc. from the outside, the light-emitting diode 500 may be covered and protected by an encapsulation layer 600. The encapsulation layer 600 may include at least one organic encapsulation layer and at least one inorganic encapsulation layer. In some embodiments, the encapsulation layer 600 may include a first inorganic encapsulation layer 610, an organic encapsulation layer 620, and a second inorganic encapsulation layer 630 that are sequentially stacked.

Each of the first inorganic encapsulation layer 610 and the second inorganic encapsulation layer 630 may include at least one inorganic insulating material. The inorganic insulating material may include an aluminum oxide, tantalum oxide, hafnium oxide, zinc oxide, silicon oxide, silicon nitride, and/or silicon oxynitride. The organic encapsulation layer 620 may include a polymer-based material. The polymer-based material may include an acryl-based resin, an epoxy-based resin, polyimide, and/or polyethylene. The acryl-based resin may include polymethylmethacrylate, poly acrylic acid, etc. However, these are only examples, and the present disclosure is not limited thereto.

Figure 4:
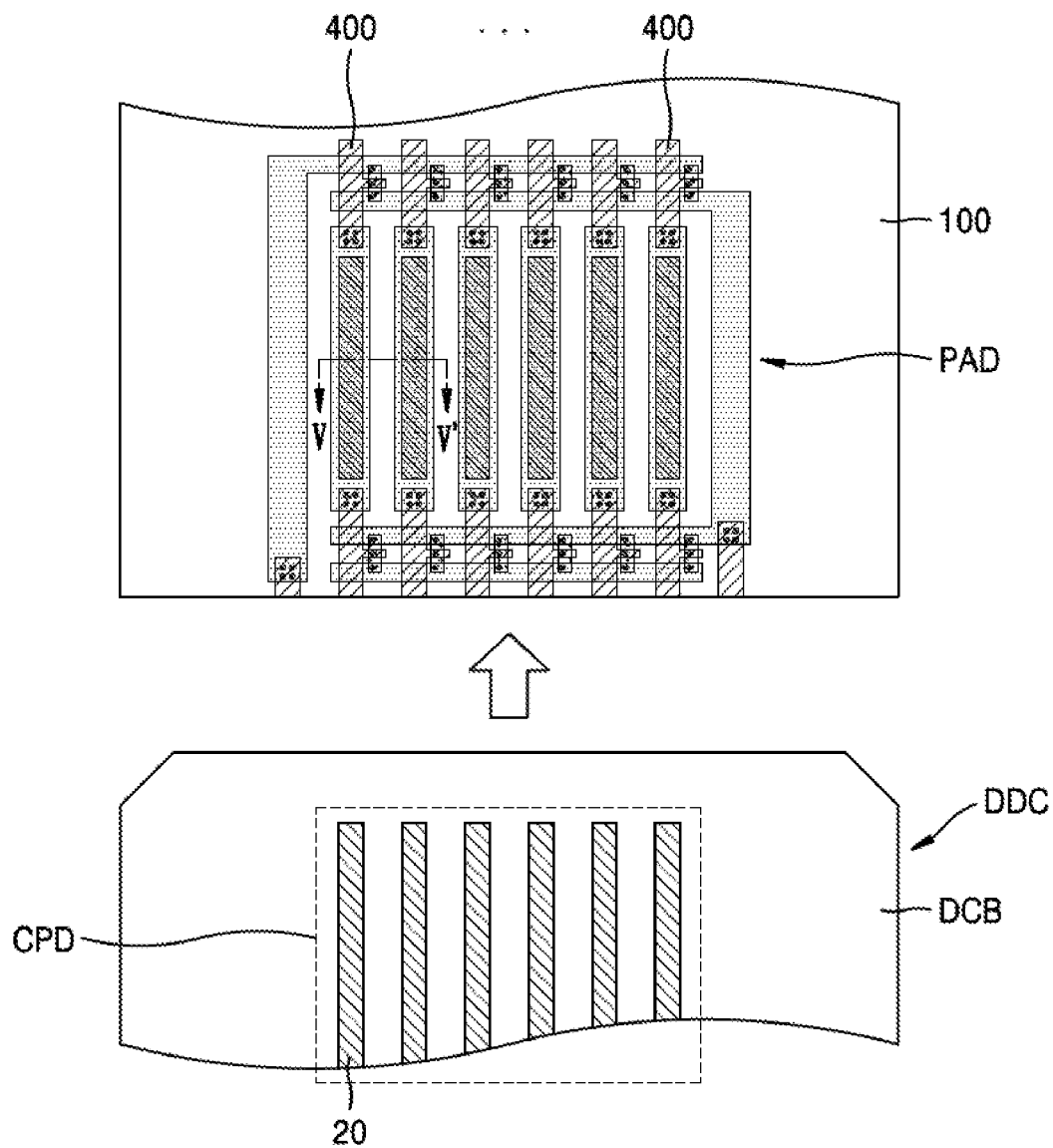
FIG. 4 is an enlarged plan view of a portion of a region A of FIG. 1.

FIG. 4 is an enlarged plan view of a portion of a region A of FIG. 1.

Referring to FIG. 4, the pad portion PAD may be arranged on one side of the substrate 100, the pad portion PAD being configured to be electrically connected to the circuit portion DDC. A counter pad CPD may be included in the flexible circuit board DCB of the circuit portion DDC, the counter pad CPD corresponding to the pad portion PAD on the substrate 100. The counter pad CPD may include a counter conductive line 20, which may overlap, and may be electrically connected to, each conductive line of the pad portion PAD. As described above with reference to FIG. 1, a data signal or a voltage generated based on a control signal of the controller SC may be transferred to the pixel circuit PC (see FIG. 3) arranged in the display area DA (see FIG. 1) through the counter conductive line 20 and the conductive line 400.

Figure 6:
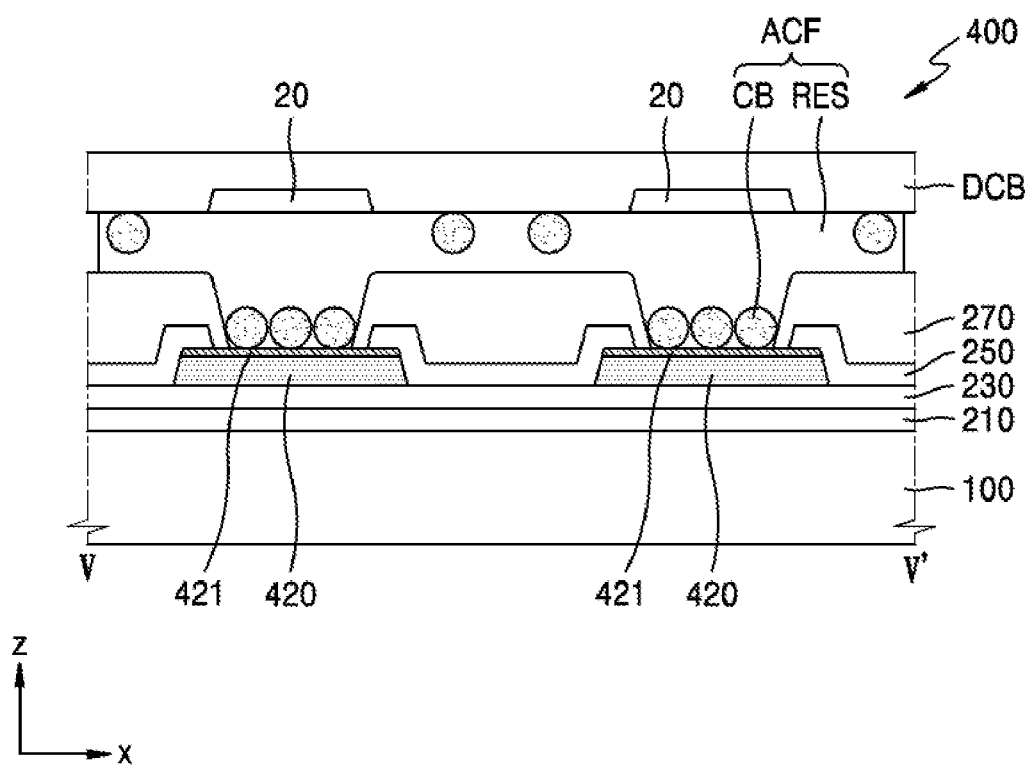
FIG. 6 is a cross-sectional view of a circuit portion electrically connected to the pad portion of FIG. 4.

FIG. 5 is a cross-sectional view of the pad portion PAD of FIG. 4, taken along the line V-V', and FIG. 6 is a cross-sectional view of the circuit portion DDC electrically connected to the pad portion PAD of FIG. 4.

Referring to FIG. 5, the conductive line 400 of the pad portion PAD may be arranged over the substrate 100. The first insulating layer 210 and the second insulating layer 230 may be arranged under the conductive line 400. The conductive line 400 may include a body portion 420. Detailed contents are further described with reference to FIG. 7.

The third insulating layer 250 may include a first opening OP1 that exposes a portion of the upper surface of the body portion 420. In other words, the third insulating layer 250 may cover the edges of the body portion 420, and may include the first opening OP1 that exposes the central portion of the body portion 420.

The fourth insulating layer 270 may be arranged on the third insulating layer 250 and may include a second opening OP2 that overlaps the first opening OP1. Though the first opening OP1 may have a greater width than that of the second opening OP2, the second opening OP2 may have a greater width than that of the first opening OP1 in other embodiments.

The body portion 420 may be concurrently/substantially simultaneously formed during the same process as a process of forming the source electrode 303, the drain electrode 305, and the third capacitor electrode 403 described above with reference to FIG. 3. The body portion 420 may include the same material as that of the source electrode 303, the drain electrode 305, and/or the third capacitor electrode 403. The body portion 420 may include a metal layer and a transparent conductive oxide layer 421 on the metal layer, the metal layer including a metal such as copper, and the transparent conductive oxide layer 421 including ITO, IZO, ZnO, or $In_2O_3$.

Referring to FIG. 6, an isotropic conductive film ACF may be arranged between the flexible circuit board DCB and the conductive line 400. The isotropic conductive film ACF may include an adhesive resin layer RES and conductive particles CB irregularly distributed inside the adhesive resin layer RES. The adhesive resin layer RES may adhere the flexible circuit board DCB to the conductive line 400. In detail, the flexible circuit board DCB may be electrically connected to the conductive line 400 by arranging the isotropic conductive film ACF between the flexible circuit board DCB and the conductive line 400, and then by compressing the flexible circuit board DCB and the conductive line 400 at high temperature. The conductive particles CB may electrically connect the body portion 420 of the conductive line 400 to the counter conductive line 20 of the flexible circuit board DCB.

Figure 7:
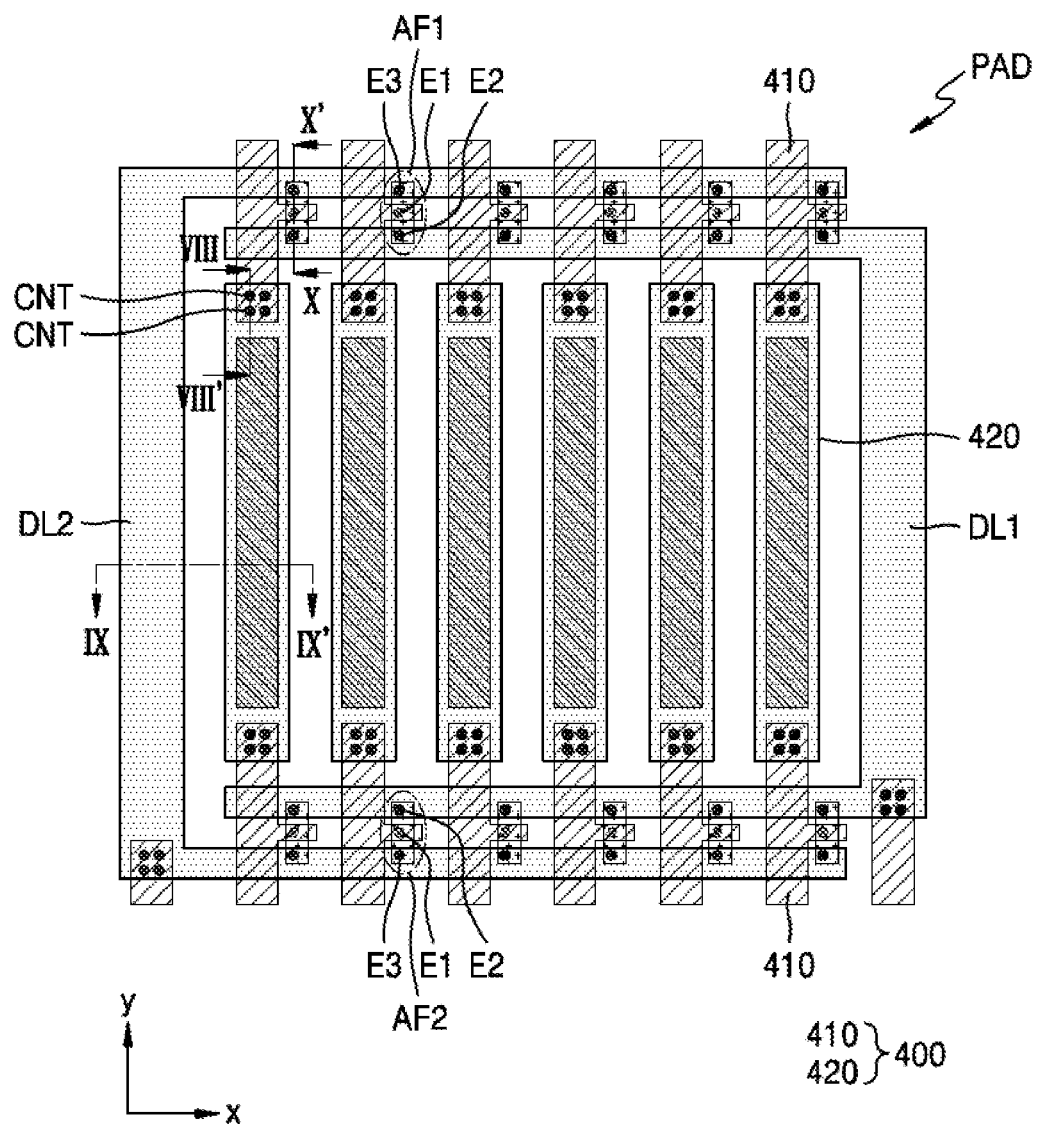
FIG. 7 is a plan view of a pad portion according to some embodiments.
Figure 8:
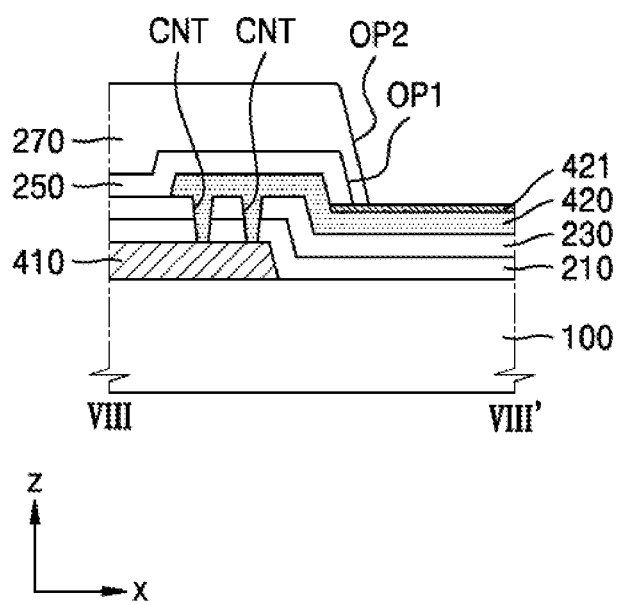
FIG. 8 is a cross-sectional view of a portion of a conductive line of FIG. 7, taken along the line VIII-VIII'.
Figure 9:
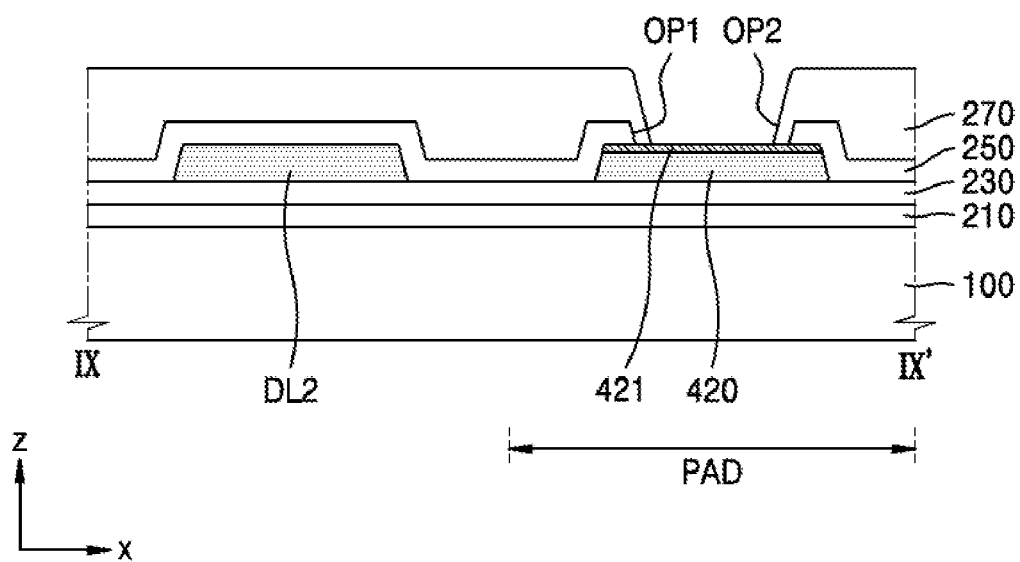
FIG. 9 is a cross-sectional view of a portion of a conductive line and a second dummy pad of FIG. 7, taken along the line IX-IX'.

FIG. 7 is a plan view of the pad portion PAD according to some embodiments, FIG. 8 is a cross-sectional view of a portion of the conductive line 400 of FIG. 7, taken along the line VIII-VIII', and FIG. 9 is a cross-sectional view of a portion of the conductive line 400 and a second dummy line DL2 of FIG. 7, taken along the line IX-IX'.

Referring to FIG. 7, the pad portion PAD may include the conductive line 400, a first anti-fuse AF1, a second anti-fuse AF2, a first dummy line DL1, and a second dummy line DL2, the first anti-fuse AF1 and the second anti-fuse AF2 being electrically connected to the conductive line 400, and the first dummy line DL1 and the second dummy line DL2 being electrically connected to the first anti-fuse AF1 and the second anti-fuse AF2.

The pad portion PAD may include a plurality of conductive lines 400. Some of the plurality of conductive lines 400 may be used to provide a data signal, another may be used to provide a driving power voltage, and another may be used to provide a common power voltage.

Each conductive line 400 may include a plurality of portions electrically connected to each other. With regard to this, it is shown in FIG. 7 that the conductive line 400 includes a pair of connectors 410 and the body portion 420. The pair of connectors 410 may be apart from each other, and may be arranged on two opposite sides of the body portion 420.

The body portion 420 and the connectors 410 may be arranged on different layers. As an example, as shown in FIG. 8, the first insulating layer 210 and the second insulating layer 230 may be arranged between the connector 410 and the body portion 420. The body portion 420 may be electrically connected to the connector 410 through a contact hole CNT passing through the first insulating layer 210 and the second insulating layer 230.

As described above with reference to FIGS. 5 and 6, the central portion of the body portion 420 may be exposed such that the body portion 420 is electrically connected to the counter conductive line 20. With regard to this, it is shown in FIG. 8 that the third insulating layer 250 on the body portion 420 includes the first opening OP1, and the fourth insulating layer 270 includes the second opening OP2, the first opening OP1 overlapping the central portion of the body portion 420, and the second opening OP2 overlapping the central portion of the body portion 420. As described above, the body portion 420 may include the metal layer and the transparent conductive oxide layer 421 on the metal layer, the metal layer including a metal such as copper, and the transparent conductive oxide layer 421 including ITO, IZO, ZnO, or $In_2O_3$.

The connector 410 may be arranged below the body portion 420, and, for example, may directly contact the upper surface of the substrate 100. The connector 410 may be formed during the same process as a process of forming the second capacitor electrode 401 described above with reference to FIG. 3, and may include the same material as that of the second capacitor electrode 401.

The first anti-fuse AF1 and the second anti-fuse AF2 may be apart from each other in the lengthwise direction of the conductive line 400. The first anti-fuse AF1 and the second anti-fuse AF2 may each include first to third electrodes E1, E2, and E3. The first electrode E1 of the first anti-fuse AF1 and the second anti-fuse AF2 may be electrically connected to the connector 410 of the conductive line 400. The first electrode E1 may be formed as one body with the connector 410 during the same process as a process of forming the connector 410. However, the present disclosure is not limited thereto. As an example, the first electrode E1 may be formed during the same process as a process of forming the connector 410 or a process that is separate from a process of forming the connector 410, and may be electrically connected to the connector 410 through a contact hole, etc.

The second electrode E2 of the first and second anti-fuses AF1 and AF2 may be electrically connected to the first dummy line DL1. The third electrode E3 of the first and second anti-fuses AF1 and AF2 may be electrically connected to the second dummy line DL2.

In the case where the conductive line 400 is damaged, one of the first dummy line DL1 and the second dummy line DL2 may correspond to a kind of bypass line or repair line configured to provide an electric signal or a voltage to a line of the pixel circuit PC instead of the damaged conductive line, the electric signal or voltage being applied to the damaged conductive line. Unlike the body portion 420 of the conductive line 400, the first dummy line DL1 and the second dummy line DL2 are not exposed to the outside. As an example, as shown in FIG. 9, the body portion 420 of the conductive line 400 overlaps the first opening OP1 and the second opening OP2, but the second dummy line DL2 may be entirely covered by the third insulating layer 250 and the fourth insulating layer 270.

One of the first dummy line DL1 and the second dummy line DL2 may be electrically connected to the damaged conductive line while insulation between the first electrode E1 and the second electrode E2, or electric insulation between the first electrode E1 and the third electrode E3, is destroyed. Hereinafter, the structure of the first and second anti-fuses AF1 and AF2 is described with reference to FIGS. 10A to 11D, and then, a path that may be bypassed when the conductive line 400 is damaged is described.

FIGS. 10A to 11D are cross-sectional views of a first anti-fuse, taken along the line X-X' of FIG. 7. Though FIGS. 10A to 11D describe the structure of the first anti-fuse AF1, the second anti-fuse AF2 having the same structure as that of the first anti-fuse AF1.

Figure 10A:
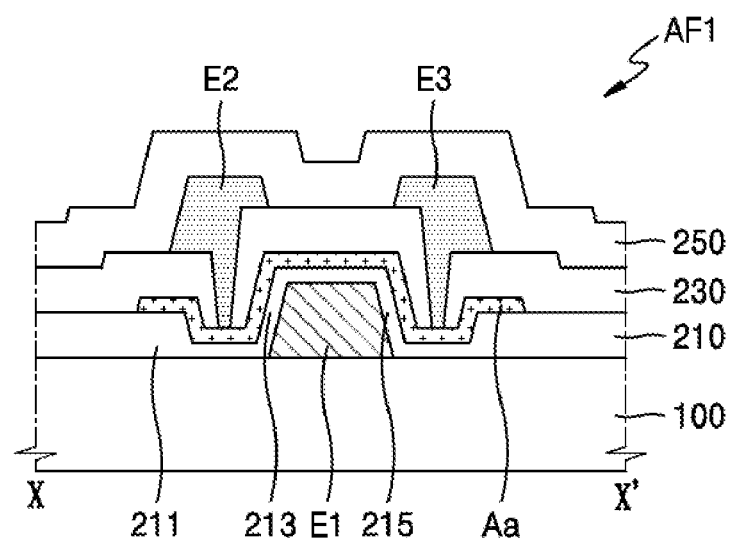
FIGS. 10A to 11D are cross-sectional views of a first anti-fuse, taken along the line X-X' of FIG. 7.

Referring to FIG. 10A, the first anti-fuse AF1 according to some embodiments may include the first to third electrodes E1, E2, and E3 electrically insulated from one another.

The first electrode E1 may be directly arranged on the upper surface of the substrate 100. As described above with reference to FIG. 7, the first electrode E1 may be formed as one body/a single unitary body with the connector 410 of the conductive line 400 (see FIG. 7).

The second electrode E2 and the third electrode E3 may be formed on a layer that is different from that of the first electrode E1. The second electrode E2 and the third electrode E3 may be arranged on the second insulating layer 230, and may be covered by the third insulating layer 250. One of the second electrode E2 and the third electrode E3 may be formed as a single body with the first dummy line DL1 described above with reference to FIG. 7, and the other of the second electrode E2 and the third electrode E3 may be formed as a single body with the second dummy line DL2. As an example, the second electrode E2 may be a portion of the first dummy line DL1, and the third electrode E3 may be a portion of the second dummy line DL2.

The first insulating layer 210 may be between the first electrode E1 and the second electrode E2, and between the first electrode E1 and the third electrode E3, such that they may be electrically insulated thereby. The first insulating layer 210 may include a first portion 211, a second portion 213, and a third portion 215, the first portion 211 being between the substrate 100 and the second insulating layer 230 and directly contacting the substrate 100 and the second insulating layer 230, the second portion 213 being between the first electrode E1 and the second electrode E2, and the third portion 215 being between the first electrode E1 and the third electrode E3. The second portion 213 and the third portion 215 may be thinner than the first portion 211 to facilitate insulation destruction between the first electrode E1 and the second electrode E2 or between the first electrode E1 and the third electrode E3 during a repair or bypassing process described below. In some embodiments, the thickness of the second portion 213 and the third portion 215 may be about 300 Å to about 800 Å.

In some embodiments, the first anti-fuse AF1 may include a semiconductor layer Aa on the first insulating layer 210. The semiconductor layer Aa may be electrically connected to the second electrode E2 and/or to the third electrode E3 through a respective contact hole passing through the second insulating layer 230. However, the present disclosure is not limited thereto. As an example, the first anti-fuse AF1 according to some embodiments may omit the semiconductor layer.

Figure 10B:
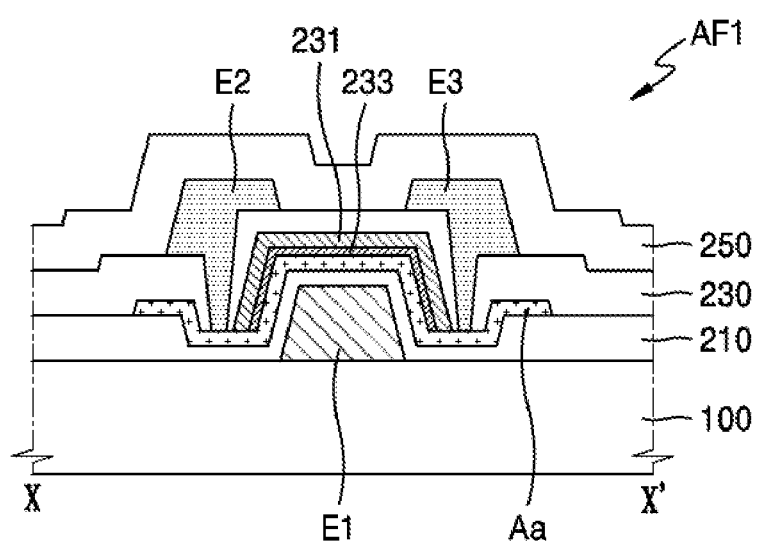

Referring to FIG. 10B, the first anti-fuse AF1 according to other embodiments may further include an upper electrode 231 and an insulating layer 233, the upper electrode 231 being on the semiconductor layer Aa of the first anti-fuse AF1, and the insulating layer 233 being between the upper electrode 231 and the semiconductor layer Aa. The upper electrode 231 may be electrically floated.

The semiconductor layer Aa and the upper electrode 231 may be formed during the same process as a process of forming the semiconductor layer 307 and the gate electrode 301 of the thin-film transistor TFT described with reference to FIG. 3, and may include the same material as those of the semiconductor layer 307 and the gate electrode 301. The upper electrode 231 may have a greater width than that of the first electrode E1. In this case, a portion of the semiconductor layer Aa that overlaps the upper electrode 231 is a portion having a less conductivity than a portion that does not overlap the upper electrode 231. Accordingly, the portion of the semiconductor layer Aa that overlaps the upper electrode 231 may facilitate insulating destruction between the first electrode E1 and the second electrode E2, and/or between the first electrode E1 and the third electrode E3, during a repair process described below.

Figure 11A:
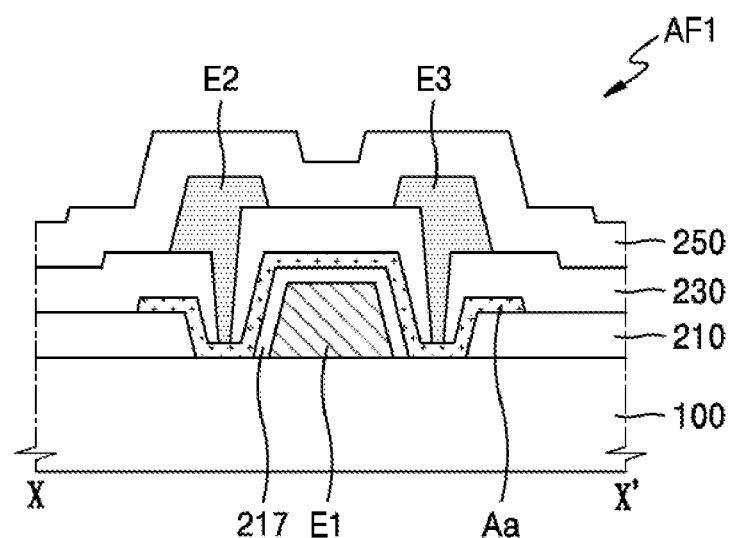

Referring to FIG. 11A, the first anti-fuse AF1 according to other embodiments may further include a metal oxide layer 217. The metal oxide layer 217 may be formed on the first electrode E1. As an example, the first electrode E1 may include a multi-layer of molybdenum (Mo) and/or aluminum (Al), and the metal oxide layer 217 including a metal oxide may be formed by performing a plasma treatment or heat treatment on the upper portion of the first electrode E1. In some embodiments, the metal oxide layer 217 may have an insulating property like aluminum oxide. The metal oxide layer 217 may have a thickness of about 100 Å to about 300 Å.

Figure 11B:
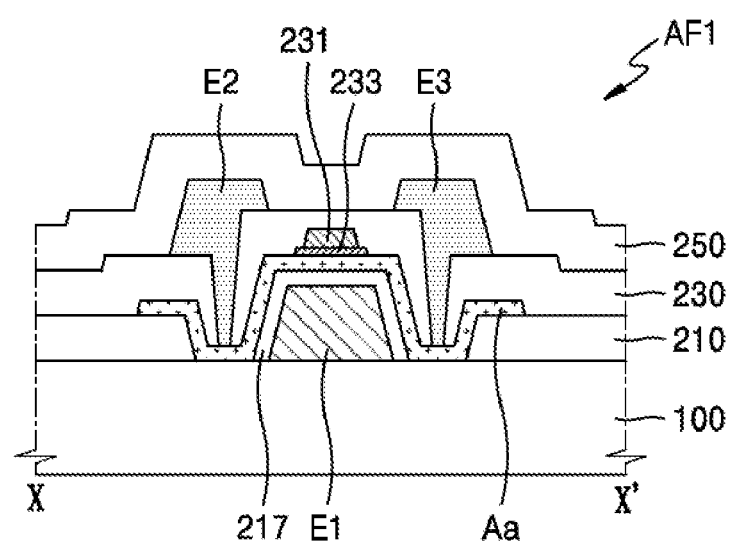
Figure 11C:
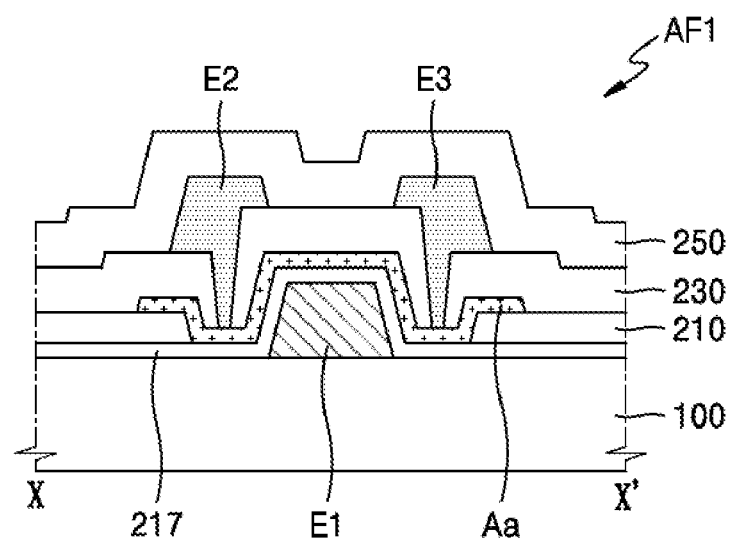

Referring to FIG. 11B, the first anti-fuse AF1 may further include the upper electrode 231 and the insulating layer 233, the upper electrode 231 being on the semiconductor layer Aa of the first anti-fuse AF1, and the insulating layer 233 being between the upper electrode 231 and the semiconductor layer Aa. Descriptions of the upper electrode 231 and the insulating layer 233 are the same as those made in FIG. 10B.

Though it is shown in FIG. 11A that the metal oxide layer 217 covers only the upper surface of the first electrode E1, the present disclosure is not limited thereto. In other embodiments, referring to FIG. 11C, the metal oxide layer 217 may extend to directly contact the upper surface of the substrate 100 beyond the first electrode E1.

Figure 11D:
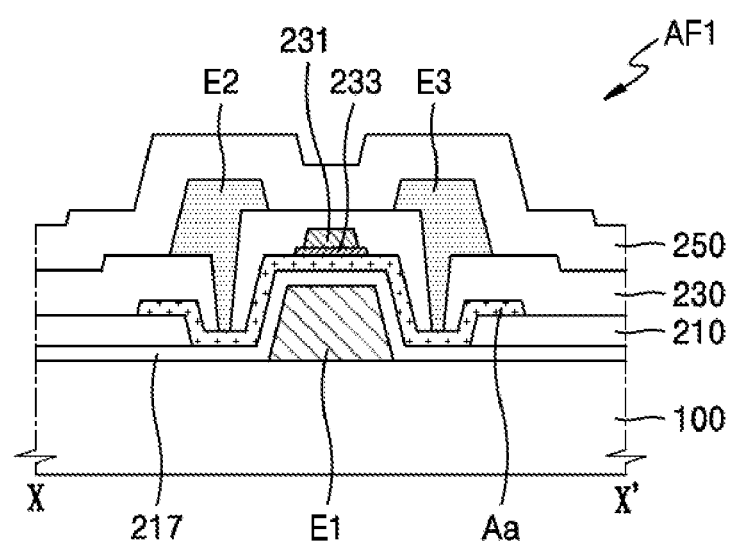

Referring to FIG. 11D, the first anti-fuse AF1 may further include the upper electrode 231 and the insulating layer 233, the upper electrode 231 being on the semiconductor layer Aa, and the insulating layer 233 being between the upper electrode 231 and the semiconductor layer Aa.

Figure 12A:
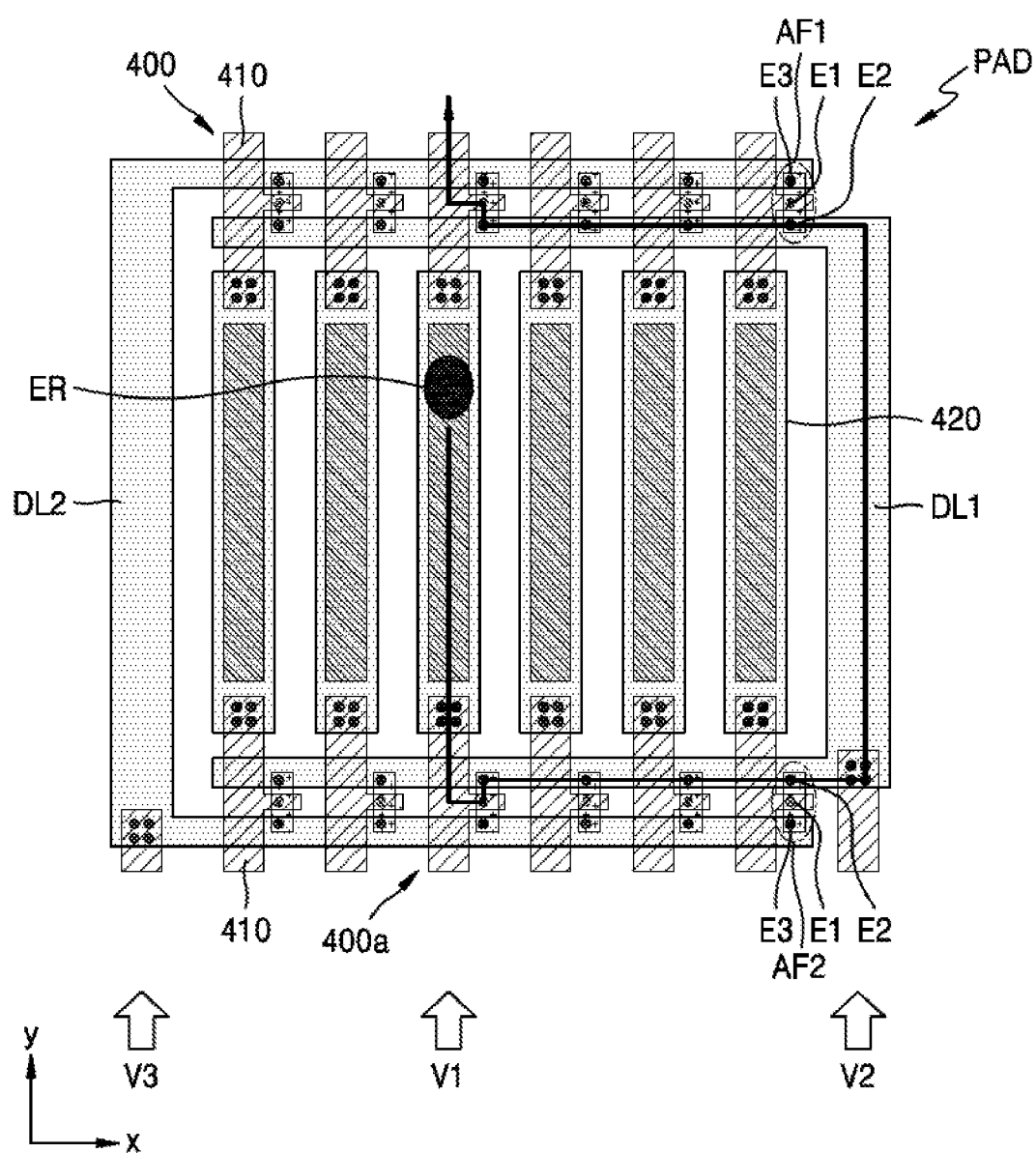
FIG. 12A is a plan view showing a method of repairing a pad portion by using a first dummy line in the case where the pad portion is damaged according to some embodiments.
Figure 12B:
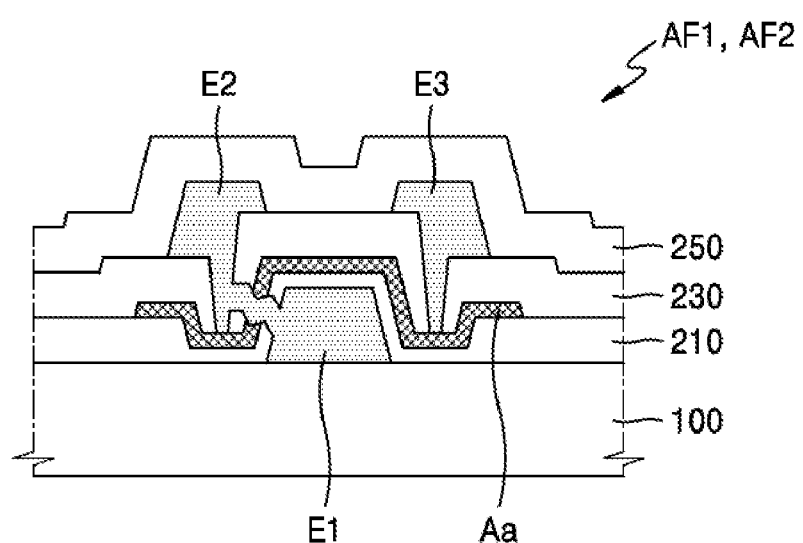
FIG. 12B is a cross-sectional view of first and second anti-fuses in an electric short-circuit state during a repair process.

FIG. 12A is a plan view showing a method of repairing the pad portion PAD by using the first dummy line DL1 in the case where the pad portion PAD is damaged according to some embodiments, and FIG. 12B is a cross-sectional view of an electric short-circuit state of first and second anti-fuses AF1 and AF2 during a repair process.

FIG. 12A shows the case where one (referred to as a damaged conductive line 400a, hereinafter) of the plurality of conductive lines 400 is damaged (ER). In some embodiments, the conductive line 400 may include a metal layer including, for example, copper, and an ITO layer on the metal layer. The ITO layer may be crystallized by heat treatment process that may be included in the manufacturing process of the display apparatus. The crystallized ITO may include a large amount of pin holes. As described above with reference to FIG. 5, the body portion 420 of the conductive line 400 is exposed through the first and second openings OP1 and OP2, and when the anode electrode is etched while the body portion 420 is exposed, etchant used during the etching process may damage the metal layer of the body portion 420 through the pin holes.

As a method of resolving this, a first voltage V1, a second voltage V2, and a third voltage V3 may be applied to the damaged conductive line 400a, the first dummy line DL1, and the second dummy line DL2, respectively. In this case, when a voltage difference between the first voltage V1 and the second voltage V2 is greater than a voltage difference between the first voltage V1 and the third voltage V3, insulation between the first electrode E1 and the second electrode E2 of each of the first and second anti-fuses AF1 and AF2 is destroyed, and the first electrode E1 may become electrically connected to the second electrode E2 as shown in FIG. 12B.

Accordingly, as shown by an arrow of FIG. 12A, a signal transferred to the damaged conductive line 400a may sequentially pass through the first electrode E1 of the second anti-fuse AF2, the second electrode E2 of the second anti-fuse AF2, the first dummy line DL1, the second electrode E2 of the first anti-fuse AF1, and the first electrode E1 of the first anti-fuse AF1, and may be transferred to a line (e.g., a data line) of the pixel circuit.

Figure 13:
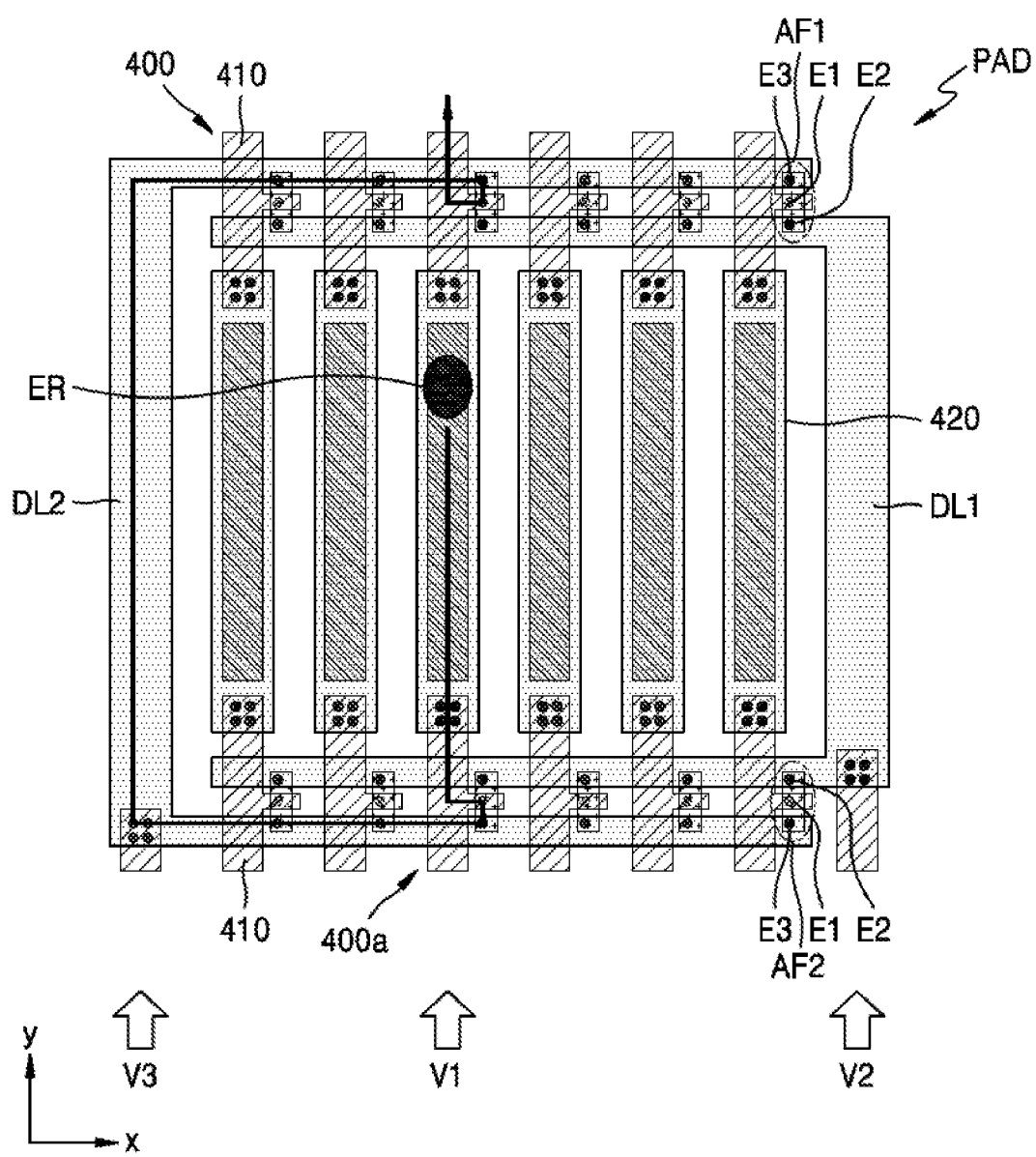
FIG. 13 is a plan view showing a method of repairing a pad portion by using a second dummy line in the case where the pad portion is damaged according to other embodiments.

FIG. 13 is a plan view showing a method of repairing the pad portion PAD by using the second dummy line DL2 in the case where the pad portion PAD is damaged according to other embodiments.

Referring to FIG. 13, a first voltage V1, a second voltage V2, and a third voltage V3 may be applied to the damaged conductive line 400a, the first dummy line DL1, and the second dummy line DL2, respectively. In this case, when a voltage difference between the first voltage V1 and the third voltage V3 is greater than a voltage difference between the first voltage V1 and the second voltage V2, insulation between the first electrode E1 and the third electrode E3 of each of the first and second anti-fuses AF1 and AF2 is destroyed and the first electrode E1 may be electrically connected to the third electrode E3.

Accordingly, as shown by an arrow of FIG. 13, a signal transferred to the damaged conductive line 400a may sequentially pass through the first electrode E1 of the second anti-fuse AF2, the third electrode E3 of the second anti-fuse AF2, the second dummy line DL2, the third electrode E3 of the first anti-fuse AF1, and the first electrode E1 of the first anti-fuse AF1, and may be transferred to a line (e.g., a data line) of the pixel circuit.

Figure 14A:
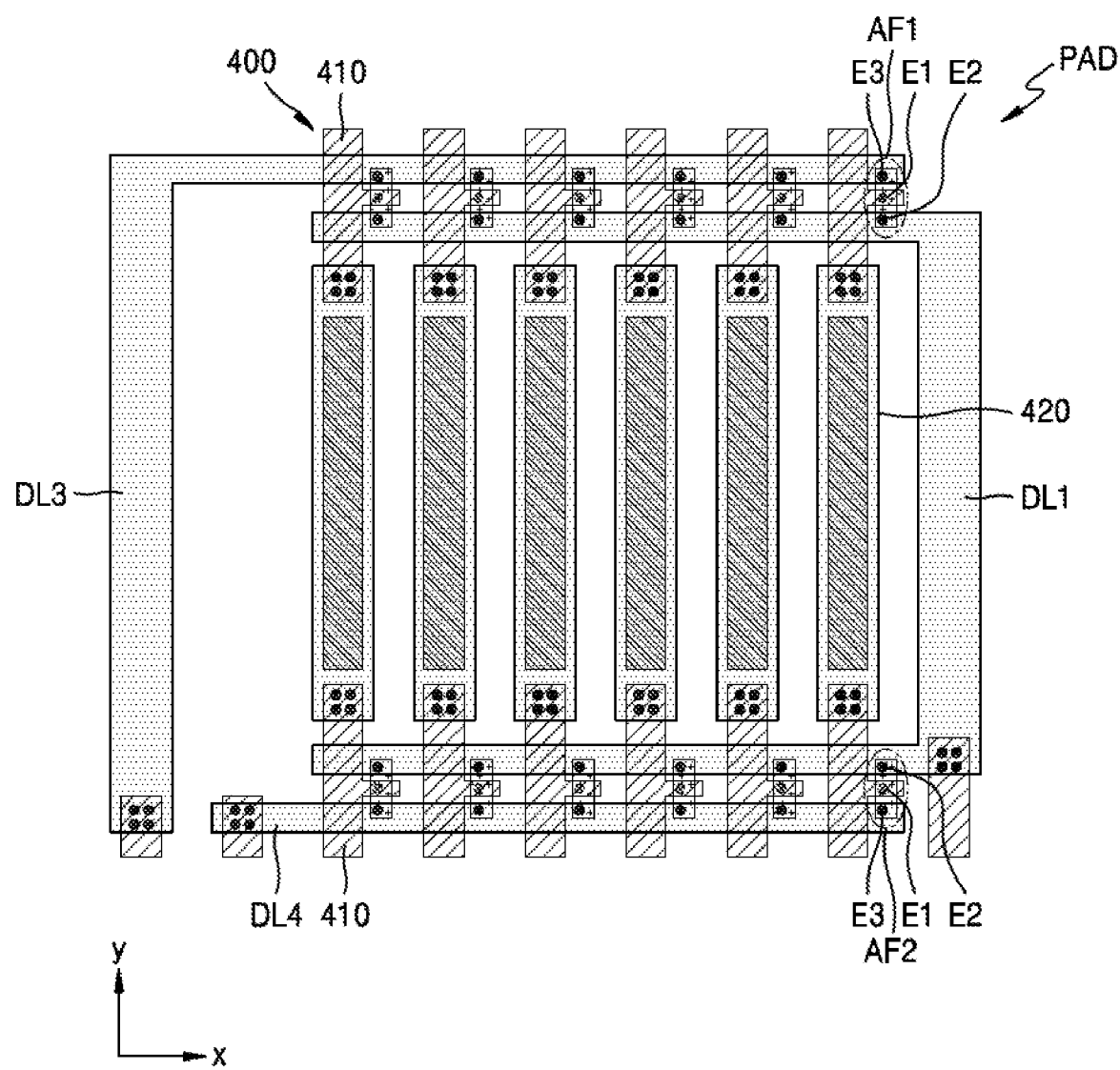
FIG. 14A is a plan view of a pad portion according to other embodiments.

FIG. 14A is a plan view of the pad portion PAD according to other embodiments.

Referring to FIG. 14A, the pad portion PAD may include the conductive line 400, the first anti-fuse AF1, the second anti-fuse AF2, the first dummy line DL1, the third dummy line DL3, and the fourth dummy line DL4, the first anti-fuse AF1 and the second anti-fuse AF2 being electrically connected to the conductive line 400, and the first dummy line DL1, the third dummy line DL3, and the fourth dummy line DL4 being electrically connected to the first anti-fuse AF1 and/or the second anti-fuse AF2. The conductive line 400 including the body portion 420 and the connectors 410, the first anti-fuse AF1, the second anti-fuse AF2, and the first dummy line DL1 are the same as those described above with reference to FIGS. 7 to 11D.

Unlike the pad portion PAD of FIG. 7, the pad portion PAD shown in FIG. 14A does not include the second dummy line DL2, and includes the third dummy line DL3 and the fourth dummy line DL4 that are electrically separated from each other. The third dummy line DL3 may be electrically connected to the third electrode E3 of the first anti-fuse AF1. The fourth dummy line DL4 may be electrically connected to the third electrode E3 of the second anti-fuse AF2.

Figure 14B:
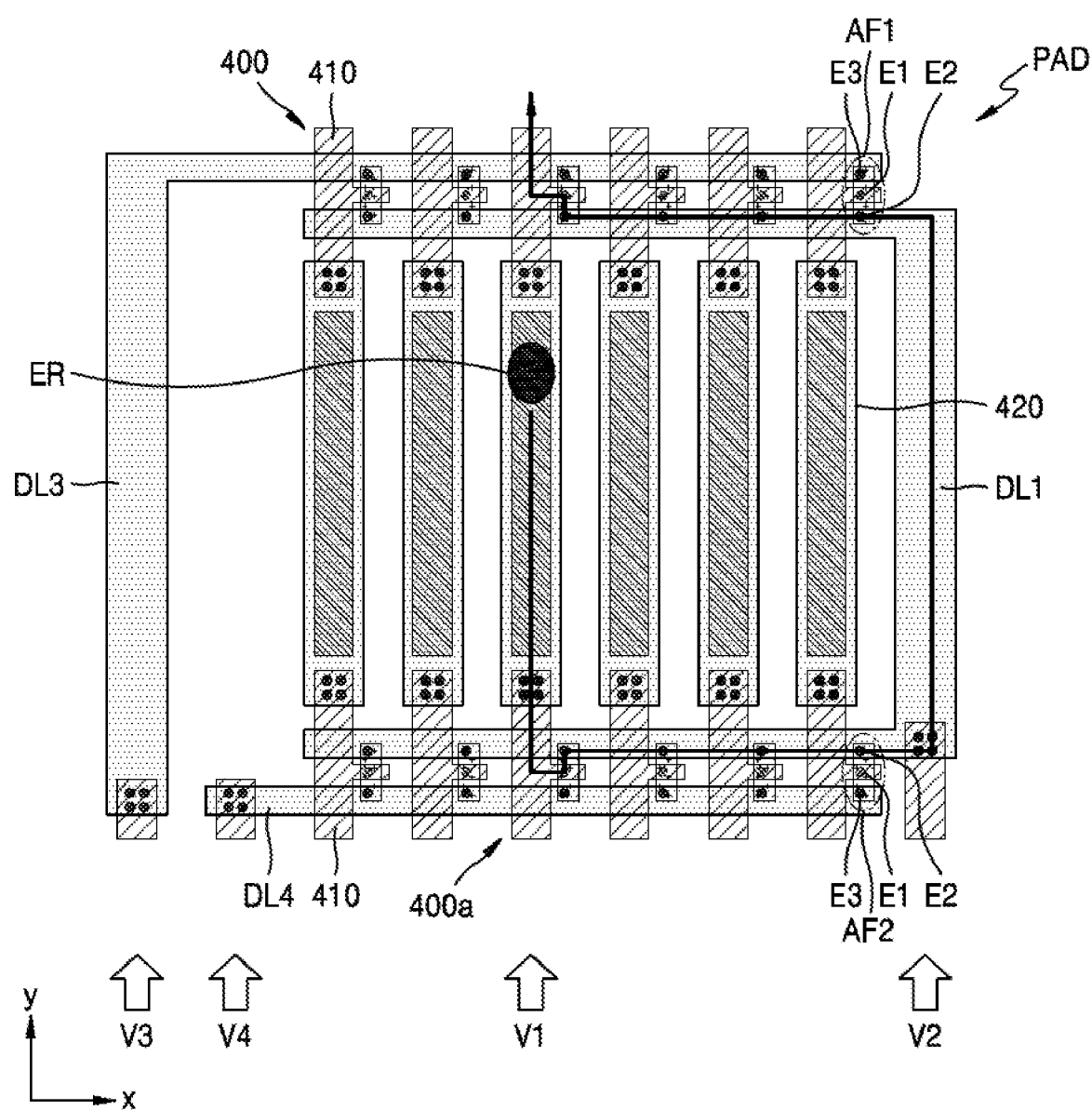
FIG. 14B is a plan view showing a method of repairing a conductive line when the conductive line of a pad portion of FIG. 14A is damaged.

FIG. 14B is a plan view showing a method of repairing the conductive line 400 when the conductive line 400 of the pad portion PAD of FIG. 14A is damaged.

Referring to FIG. 14B, first, a first voltage V1, a second voltage V2, and a third voltage V3 may be applied to the damaged conductive line 400a, the first dummy line DL1, and the third dummy line DL3, respectively. In this case, a voltage difference between the first voltage V1 and the second voltage V2 may be greater than a voltage difference between the first voltage V1 and the third voltage V3. In this case, insulation between the first electrode E1 and the second electrode E2 of the first anti-fuse AF1 is destroyed, and the first electrode E1 may be electrically connected to the second electrode E2 as shown in FIG. 12B.

Then, a first voltage V1, a second voltage V2, and a fourth voltage V4 may be applied to the damaged conductive line 400a, the first dummy line DL1, and the fourth dummy line DL4, respectively. In this case, a voltage difference between the first voltage V1 and the second voltage V2 may be greater than a voltage difference between the first voltage V1 and the fourth voltage V4. In this case, insulation between the first electrode E1 and the second electrode E2 of the second anti-fuse AF2 is destroyed, and the first electrode E1 may be electrically connected to the second electrode E2 as shown in FIG. 12B.

Accordingly, as shown by an arrow of FIG. 14B, a signal transferred to the damaged conductive line 400a may sequentially pass through the first electrode E1 of the second anti-fuse AF2, the second electrode E2 of the second anti-fuse AF2, the first dummy line DL1, the second electrode E2 of the first anti-fuse AF1, and the first electrode E1 of the first anti-fuse AF1, and may be then transferred to a line (e.g., a data line) of the pixel circuit.

Figure 15A:
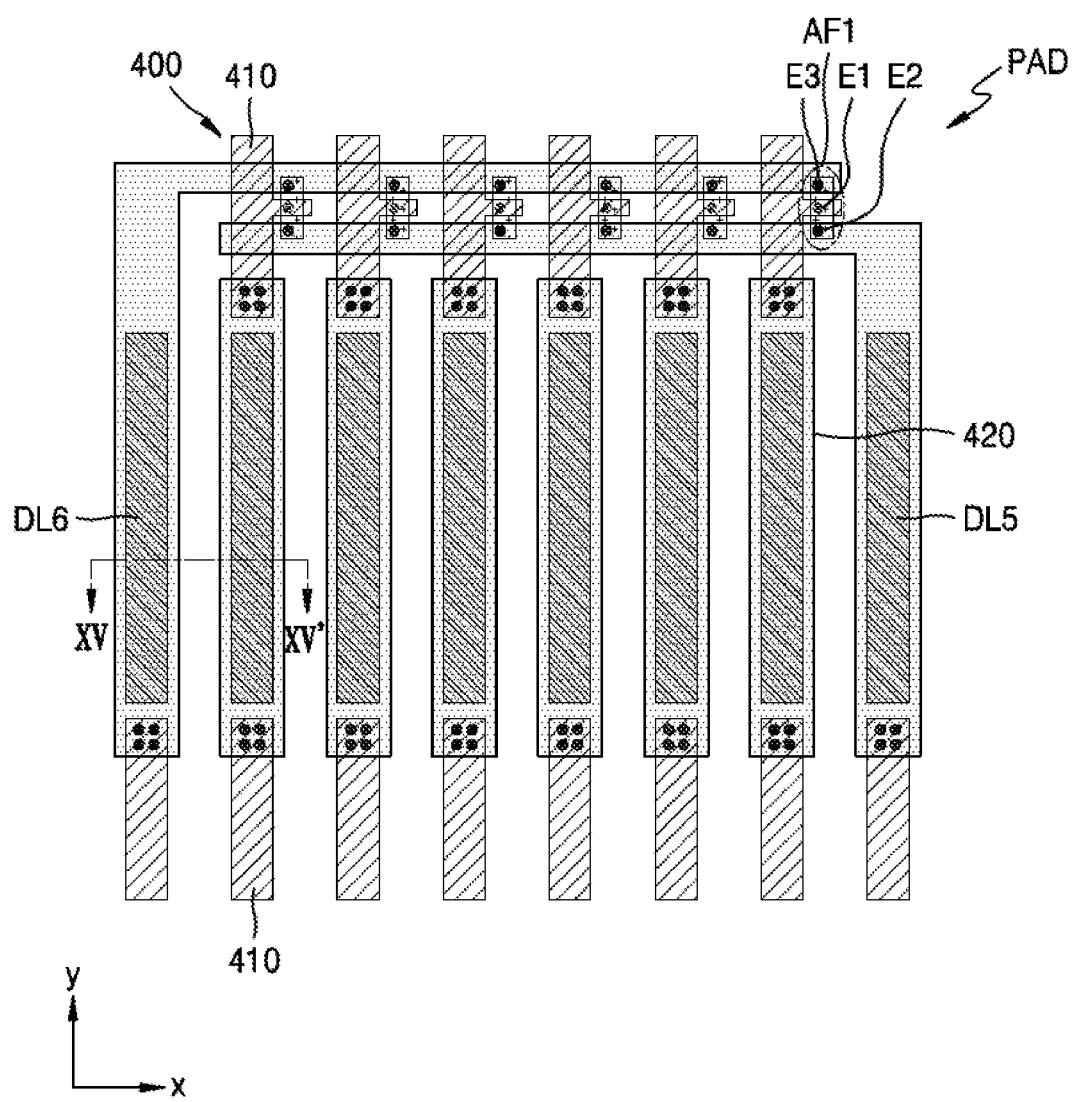
FIGS. 15A and 15B are plan views of a pad portion according to other embodiments.
Figure 15B:
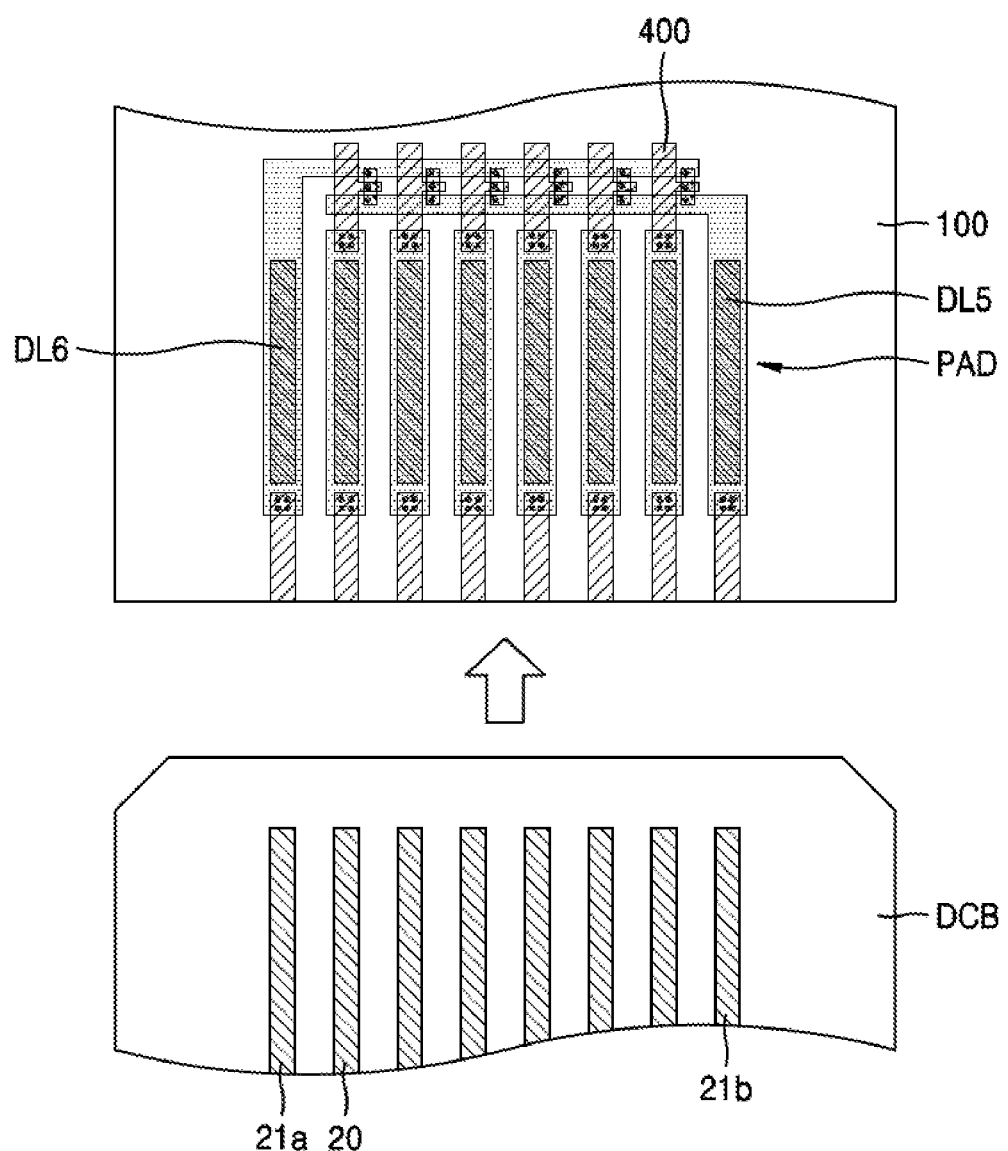
Figure 15C:
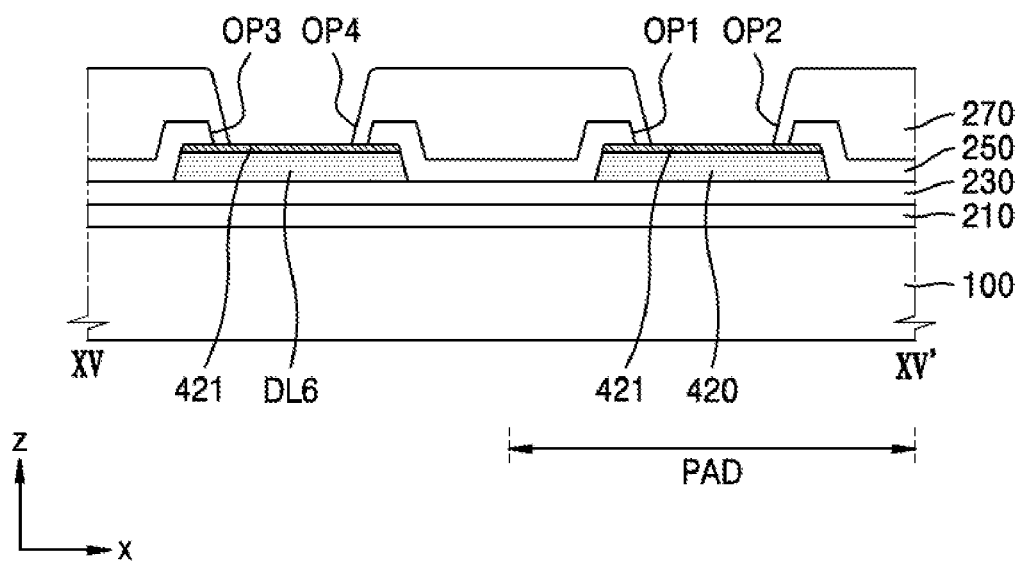
FIG. 15C is a cross-sectional view of the pad portion, taken along the line XV-XV' of FIG. 15A.

FIGS. 15A and 15B are plan views of the pad portion PAD according to other embodiments, and FIG. 15C is a cross-sectional view of the pad portion, taken along the line XV-XV' of FIG. 15A. In FIGS. 15A and 15C, the same reference numerals as those of FIG. 7 denote the same members, and thus, repeated descriptions thereof are omitted.

Referring to FIG. 15A, the pad portion PAD may include the conductive line 410 including the body portion 420 and the connectors 410, the first anti-fuse AF1, a dummy line (referred to as a fifth dummy line DL5, hereinafter), and a dummy line (referred to as a sixth dummy line DL6, hereinafter), the first anti-fuse AF1 being electrically connected to the conductive line 400, the fifth dummy line DL5 being electrically connected to the second electrode E2 of the first anti-fuse AF1, and the sixth dummy line DL6 being electrically connected to the third electrode E3 of the first anti-fuse AF1.

Referring to FIG. 15B, the flexible circuit board DCB connected to the pad portion PAD of FIG. 15A may further include a first counter conductive line 21a and a second counter conductive line 21b, the first counter conductive line 21a and the second counter conductive line 21b respectively overlapping the sixth dummy line DL6 and the fifth dummy line DL5, and being electrically connected to the fifth dummy line DL5 and the sixth dummy line DL6.

The central portion of the sixth dummy line DL6 may be exposed such that the sixth dummy line DL6 is electrically connected to the first counter conductive line 21a. With regard to this, it is shown in FIG. 15C that the third insulating layer 250 on the sixth dummy line DL6 includes a third opening OP3 that overlaps the central portion of the sixth dummy line DL6, and the fourth insulating layer 270 includes the fourth opening OP4 that overlaps the central portion of the sixth dummy line DL6. Though FIG. 15C shows only the sixth dummy line DL6, the fifth dummy line DL5 may have the same structure as that of the sixth dummy line DL6.

Figure 16A:
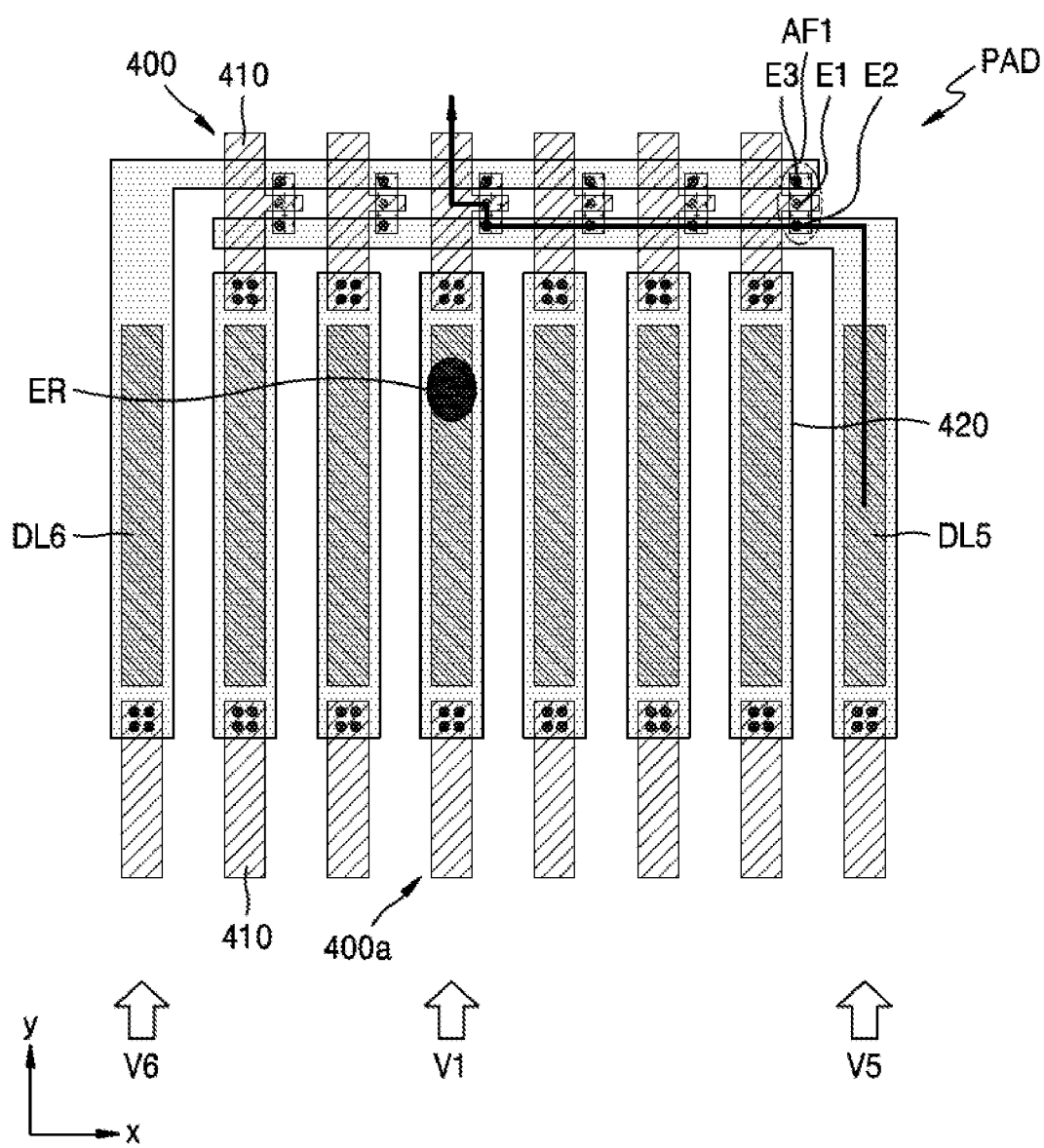
FIGS. 16A and 16B are plan views showing a method of operating a repaired pad portion by using a dummy line in the case where the pad portion is damaged, according to other embodiments.
Figure 16B:
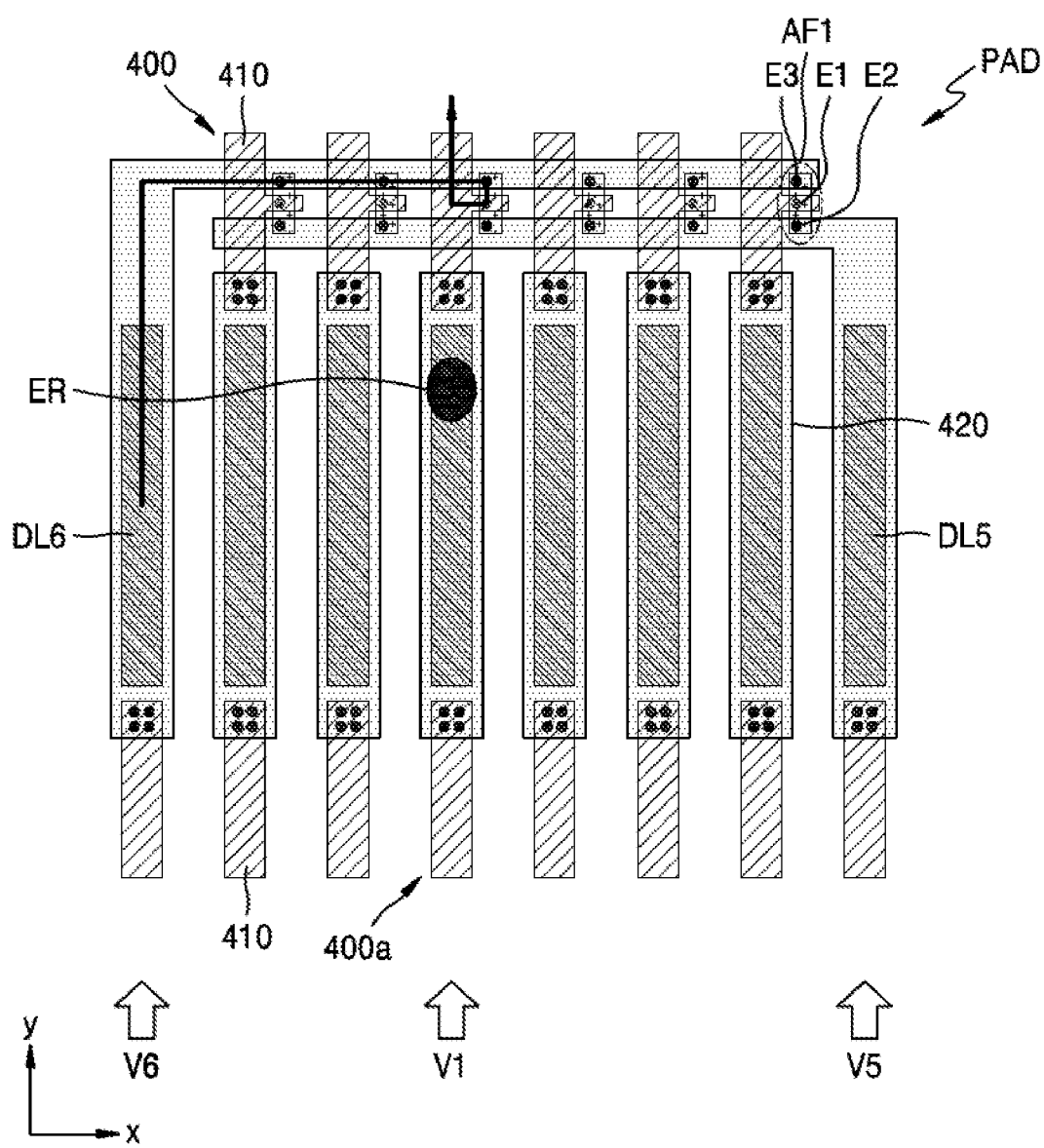

FIGS. 16A and 16B are plan views showing a method of operating the repaired pad portion PAD by using a dummy line in the case where the pad portion PAD is damaged according to other embodiments. In FIGS. 16A and 16B, the same reference numerals as those of FIG. 7 denote the same members, and thus, repeated descriptions thereof are omitted.

Referring to FIG. 16A, a first voltage V1 may be applied to the damaged conductive line 400a, and a fifth voltage V5 and a sixth voltage V6 may be applied to the fifth dummy line DL5 and the sixth dummy line DL6, respectively. In this case, a voltage difference between the first voltage V1 and the fifth voltage V5 may be greater than a voltage difference between the first voltage V1 and the sixth voltage V6. In this case, insulation between the first electrode E1 and the second electrode E2 of the first anti-fuse AF1 is destroyed, and the first electrode E1 may be electrically connected to the second electrode E2 as shown in FIG. 12B.

Accordingly, a signal transferred to the fifth dummy line DL5 through the second counter conductive line 21b (see FIG. 15B) may sequentially pass through the second electrode E2 of the first anti-fuse AF1 and the first electrode E1 of the first anti-fuse AF1, and may be transferred to a line (e.g., a data line) of the pixel circuit.

Referring to FIG. 16B, a voltage difference between the first voltage V1 and the sixth voltage V6 may be greater than a voltage difference between the first voltage V1 and the fifth voltage V5. In this case, insulation between the first electrode E1 and the third electrode E3 of the first anti-fuse AF1 is destroyed, and the first electrode E1 may be electrically connected to the third electrode E3.

Accordingly, a signal transferred to the sixth dummy line DL6 through the first counter conductive line 21a (see FIG. 15B) may sequentially pass through the third electrode E3 of the first anti-fuse AF1 and the first electrode E1 of the first anti-fuse AF1, and may be transferred to a line (e.g., a data line) of the pixel circuit.

Some embodiments may implement a display apparatus including a pad portion with a reduced defect. However, the scope of the present disclosure is not limited by this effect.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a display area comprising pixels on a substrate;
   a pad portion on the substrate in a non-display area outside the display area, and comprising:
      a conductive line;
      a first dummy line around the conductive line; and
      a first anti-fuse and a second anti-fuse adjacent to the conductive line and spaced apart from each other in a lengthwise direction of the conductive line, the first anti-fuse and the second anti-fuse each comprising:
         a first electrode electrically connected to a portion of the conductive line; and
         a second electrode over the first electrode with a first insulating layer therebetween, and electrically connected to a portion of the first dummy line; and
   a circuit portion overlapping, and electrically connected to, the pad portion.

2. The display apparatus of claim 1, wherein the first electrode of the first anti-fuse and the first electrode of the second anti-fuse are integral with a portion of the conductive line.

3. The display apparatus of claim 1, wherein the conductive line comprises:
   a body portion overlapping the circuit portion; and
   a pair of connectors respectively on opposite sides of the body portion, and connected to the body portion through an insulating layer between the body portion and the pair of connectors.

4. The display apparatus of claim 1, wherein the first anti-fuse and the second anti-fuse each further comprise a third electrode spaced apart from the first electrode with the first insulating layer therebetween.

5. The display apparatus of claim 4, wherein the pad portion further comprises a second dummy line electrically connected to the third electrode of the first anti-fuse and to the third electrode of the second anti-fuse.

6. The display apparatus of claim 5, wherein the second dummy line is integral with the third electrode of the first anti-fuse and with the third electrode of the second anti-fuse.

7. The display apparatus of claim 6, wherein the first insulating layer comprises:
   a first portion on the substrate;
   a second portion between the first electrode and the second electrode, and having a thickness that is less than a thickness of the first portion; and
   a third portion between the first electrode and the third electrode, and having a thickness that is less than the thickness of the first portion.

8. The display apparatus of claim 1, wherein at least one of the first anti-fuse and the second anti-fuse further comprises a metal oxide layer on the first electrode thereof.

9. The display apparatus of claim 1, wherein at least one of the first anti-fuse and the second anti-fuse further comprises a semiconductor layer connected to the second electrode thereof, and located between the first electrode and the second electrode thereof.

10. The display apparatus of claim 9, wherein at least one of the first anti-fuse and the second anti-fuse further comprises an upper electrode on the semiconductor layer.

11. The display apparatus of claim 10, wherein an area of the upper electrode is greater than an area of the first electrode.

12. The display apparatus of claim 4, wherein the pad portion further comprises:
   a third dummy line electrically connected to the third electrode of the first anti-fuse; and
   a fourth dummy line spaced apart from the third dummy line, and electrically connected to the third electrode of the second anti-fuse.

13. The display apparatus of claim 12, wherein the third dummy line is integral with the third electrode of the first anti-fuse, and
   wherein the fourth dummy line is integral with the third electrode of the second anti-fuse.

14. A display apparatus comprising:
   a display area comprising pixels on a substrate;
   a pad portion on the substrate in a non-display area outside the display area, and comprising:
      a conductive line;
      a first dummy line; and
      a first anti-fuse electrically connected to the conductive line and to the first dummy line, and comprising a first electrode, and a second electrode spaced apart from the first electrode with a first insulating layer therebetween; and
   a circuit portion overlapping the pad portion and electrically connected to the pad portion, and comprising a counter conductive line overlapping the conductive line, and a first counter conductive line overlapping the first dummy line.

15. The display apparatus of claim 14, further comprising an upper insulating layer covering an edge of the first dummy line, and defining an opening overlapping the first dummy line.

16. The display apparatus of claim 14, wherein the first anti-fuse further comprises a third electrode spaced apart from the first electrode with the first insulating layer therebetween.

17. The display apparatus of claim 16, wherein the pad portion further comprises a second dummy line electrically connected to the third electrode of the first anti-fuse.

18. The display apparatus of claim 17, wherein the circuit portion further comprises a second counter conductive line overlapping the second dummy line.

19. The display apparatus of claim 17, wherein the first insulating layer comprises:
   a first portion on the substrate;
   a second portion between the first electrode and the second electrode, and having a thickness that is less than a thickness of the first portion; and
   a third portion between the first electrode and the third electrode, and having a thickness that is less than the thickness of the first portion.

20. The display apparatus of claim 14, wherein the conductive line comprises:
   a body portion overlapping the circuit portion; and
   a pair of connectors respectively on opposite sides of the body portion, and connected to the body portion through an insulating layer between the body portion and the pair of connectors.

* * * * *